(12) United States Patent
Li

(10) Patent No.: US 8,807,796 B2
(45) Date of Patent: Aug. 19, 2014

(54) INTEGRALLY FORMED LIGHT EMITTING DIODE LIGHT WIRE AND USES THEREOF

(75) Inventor: Eddie Ping Kuen Li, Hong Kong (CN)

(73) Assignee: Huizhou Light Engine Ltd., Huizhou (CN)

( * ) Notice: Subject to any disclaimer, the term of this patent is extended or adjusted under 35 U.S.C. 154(b) by 253 days.

(21) Appl. No.: 13/584,563

(22) Filed: Aug. 13, 2012

(65) Prior Publication Data
US 2012/0326634 A1 Dec. 27, 2012

Related U.S. Application Data

(63) Continuation-in-part of application No. 12/703,116, filed on Feb. 9, 2010, now Pat. No. 8,567,992, which is a continuation-in-part of application No. 12/355,655, filed on Jan. 16, 2009, now Pat. No. 8,052,303, which is a continuation-in-part of application No. 11/854,145, filed on Sep. 12, 2007, now Pat. No. 7,988,332.

(60) Provisional application No. 60/844,184, filed on Sep. 12, 2006.

(51) Int. Cl.
*F21S 4/00* (2006.01)
*F21V 23/04* (2006.01)
*F21V 23/06* (2006.01)
*H05B 33/08* (2006.01)
*H05B 37/02* (2006.01)
*F21Y 101/02* (2006.01)
*F21S 2/00* (2006.01)
*F21Y 103/00* (2006.01)

(52) U.S. Cl.
CPC .............. *H05B 33/083* (2013.01); *F21S 4/002* (2013.01); *H05B 33/0854* (2013.01); *F21S 4/006* (2013.01); *F21Y 2101/02* (2013.01); *H05B 33/0803* (2013.01); *H05B 33/0827* (2013.01); *H05B 37/0254* (2013.01); *F21S 2/005* (2013.01); *F21Y 2103/003* (2013.01); *Y10S 362/80* (2013.01)
USPC .................. 362/249.06; 362/231; 362/249.05; 362/276; 362/800; 315/312

(58) Field of Classification Search
CPC ........... F21Y 2101/02; F21Y 2103/003; F21S 2/005; F21S 4/001; F21S 4/002; F21S 4/003; F21S 4/005; F21S 4/006; F21S 4/007; H05B 33/0803; H05B 33/0842; H05B 33/0884; H05B 33/0848; H05B 33/0854; H05B 33/0881; H05B 33/083; H05B 33/0827
USPC ............. 362/249.02, 249.04, 249.05, 249.06, 362/249.08, 249.12, 249.13, 246, 267, 276, 362/231, 234, 800, 802; 315/185 R, 185 S, 315/192, 291, 294, 312, 318
See application file for complete search history.

(56) References Cited

U.S. PATENT DOCUMENTS

| | | | |
|---|---|---|---|
| 4,546,041 A | 10/1985 | Keane et al. | |
| 4,761,720 A | 8/1988 | Solow | |
| 5,392,200 A | 2/1995 | Milde | |
| 5,632,550 A * | 5/1997 | Yeh ............................... | 362/123 |
| 5,769,527 A | 6/1998 | Taylor et al. | |
| 5,848,837 A | 12/1998 | Gustafson | |
| 5,927,845 A | 7/1999 | Gustafson et al. | |
| 5,941,626 A | 8/1999 | Yamuro | |
| 6,074,074 A | 6/2000 | Marcus | |
| 6,113,248 A | 9/2000 | Mistopoulos et al. | |
| 6,541,800 B2 | 4/2003 | Barnett et al. | |
| 6,604,841 B2 | 8/2003 | Liu | |
| 6,673,277 B1 | 1/2004 | Joseph et al. | |
| 6,673,292 B1 | 1/2004 | Gustafson et al. | |
| 6,777,891 B2 | 8/2004 | Lys et al. | |
| 6,840,655 B2 | 1/2005 | Shen | |
| 6,866,394 B1 | 3/2005 | Hutchins et al. | |
| 6,874,904 B2 | 4/2005 | Hsu | |
| 6,933,444 B2 | 8/2005 | Albert et al. | |
| 7,015,825 B2 | 3/2006 | Callahan | |
| 7,021,792 B2 | 4/2006 | Lin | |
| 7,128,438 B2 | 10/2006 | Ratcliffe | |
| 7,140,751 B2 | 11/2006 | Lin | |
| 7,173,383 B2 | 2/2007 | Vornsand et al. | |
| 7,178,941 B2 | 2/2007 | Roberge et al. | |
| 7,235,815 B2 | 6/2007 | Wang | |

| | | | |
|---|---|---|---|
| 7,248,756 B2 * | 7/2007 | Ebbesen et al. | 385/14 |
| 7,273,300 B2 | 9/2007 | Mrakovich | |
| 7,400,029 B2 | 7/2008 | Shimada et al. | |
| 7,465,056 B2 | 12/2008 | Peng | |
| 7,490,957 B2 * | 2/2009 | Leong et al. | 362/249.05 |
| 7,508,141 B2 | 3/2009 | Wong | |
| 7,592,276 B2 * | 9/2009 | Hill et al. | 442/301 |
| 7,701,151 B2 | 4/2010 | Petrucci et al. | |
| 7,948,190 B2 | 5/2011 | Grajcar | |
| 7,980,730 B2 * | 7/2011 | Kufferath-Kassner et al. | 362/249.15 |
| 7,988,332 B2 | 8/2011 | Lo et al. | |
| 8,021,020 B2 * | 9/2011 | Costello et al. | 362/249.15 |
| 8,052,303 B2 | 11/2011 | Lo et al. | |
| 2001/0036082 A1 | 11/2001 | Kanesaka | |
| 2004/0037079 A1 | 2/2004 | Luk | |
| 2005/0036310 A1 | 2/2005 | Fan | |
| 2005/0077525 A1 | 4/2005 | Lynch et al. | |
| 2005/0104059 A1 | 5/2005 | Friedman et al. | |
| 2005/0243556 A1 | 11/2005 | Lynch | |
| 2006/0180827 A1 | 8/2006 | Wang | |
| 2008/0036971 A1 | 2/2008 | Hasegawa | |
| 2008/0038506 A1 * | 2/2008 | Schumacher et al. | 428/72 |
| 2008/0122384 A1 | 5/2008 | Chan | |
| 2008/0137332 A1 | 6/2008 | Lo et al. | |
| 2009/0154156 A1 | 6/2009 | Lo et al. | |

FOREIGN PATENT DOCUMENTS

| | | |
|---|---|---|
| CN | 1170109 A | 1/1998 |
| CN | 2708092 Y | 7/2005 |
| DE | 10051528 | 5/2002 |
| DE | 20216833 | 3/2004 |
| EP | 0760448 | 3/1997 |
| EP | 0 898 442 A1 | 2/1999 |
| EP | 0911573 | 4/1999 |
| EP | 1357331 A2 | 10/2003 |
| JP | 61-182587 | 11/1986 |
| JP | 61-182587 U | 11/1986 |
| JP | 09003709 A | 1/1997 |
| JP | 9-185911 | 7/1997 |
| JP | 11-191494 | 7/1999 |
| JP | 11-191494 A | 7/1999 |
| JP | 11-249607 | 9/1999 |
| JP | 11-249607 A | 9/1999 |
| JP | 11-273419 | 10/1999 |
| JP | 2000-343757 A | 12/2000 |
| JP | 2003-511817 A | 3/2003 |
| JP | 2003-347593 A | 5/2003 |
| JP | 2004-276737 A | 10/2004 |
| JP | 2007-335345 A | 12/2007 |
| JP | 2008-040206 A | 2/2008 |
| JP | 2008-513935 | 5/2008 |
| JP | 2008-513935 A | 5/2008 |
| JP | 2009-528685 | 8/2009 |
| JP | 2009-538440 A | 11/2009 |
| KR | 100452394 B1 | 1/2005 |
| TW | 200823409 A | 6/2008 |
| WO | WO-98/10219 A1 | 3/1998 |
| WO | WO-01/25681 A1 | 4/2001 |
| WO | WO-02/098182 A2 | 12/2002 |
| WO | WO 2006/029566 | 3/2006 |
| WO | WO 2007/138494 A1 | 12/2007 |
| WO | WO-2008/031580 A1 | 3/2008 |

OTHER PUBLICATIONS

Office Action issued in Japanese Application No. 2011-541235, mailing date Dec. 18, 2012 (with English translation).
Apr. 3, 2014 Office Action for Korean Patent Application No. 10-2013-7020142 (with English translation).
PCT Notification of Transmittal of The International Search Report and The Written Opinion of the International Searching Authority, or the Declaration issued in connection with related PCT International Application No. PCT/EP2007/007948 dated Feb. 14, 2008.
Written Opinion of the International Searching Authority dated May 29, 2009 in connection with related PCT Application No. PCT/EP2009/050581.
Notification of Transmittal of the International Seach Report and The Written Opinion of the International Searching Authority , or the Declaration dated May 29, 2009 in connection with related PCT Application No. PCT/EP2009/050581.
International Search Report dated May 29, 2009 in connection with related PCT Application No. PCT/EP2009/050581.
PCT Notification of Transmittal of The International Search Report and The Written Opinion of the International Searching Authority, or the Declaration issued in connection with related PCT International Application No. PCT/EP2010/0051784 dated Oct. 14, 2010.
PCT International Search Report issued in connection with related PCT International Application No. PCT/EP2010/0051784 dated Oct. 14, 2010.
First Office Action issued by China's State Intellectual Property Office dated Nov. 27, 2009 in connection with Chinese Patent Application No. 200780001712.3.
EPO Espacenet machine English translation of cited DE10051528 A1, May 2, 2002, description only.
PCT Written Opinion of the International Searching Authority issued in connection with related PCT International Application No. PCT/EP2010/0051784 dated Oct. 14, 2010.
English translation of Korean Office Action issued Sep. 8, 2012 in connection with Korean Patent Application KR 10-2011-7009262.
Japanese Office Action issued for corresponding application JP 2011-245422, mailing date Nov. 6, 2012 (with English translation).
Japanese Office Action dated Mar. 3, 2014 for Japanese Patent Application No. 2011-541235.
Dec. 3, 2013 Office Action for Japanese Application No. 2012-538247.
Sep. 3, 2013 Office Action for Japanese Patent Application No. 2013-96787 (with English translation).

* cited by examiner

*Primary Examiner* — Alan Cariaso
(74) *Attorney, Agent, or Firm* — Schiff Hardin LLP

(57) ABSTRACT

Integrally formed LED light wires are provided, comprising a conductive base comprising a support substrate, wherein the support substrate comprises a first plurality of wires, threads, or a combination thereof, wherein the plurality of wires, threads, or a combination thereof comprises at least one weft element arranged in a first direction and at least two warp elements, each arranged in a second direction such that the at least one weft element and each of the at least two warp elements form plural intersections therebetween, a first bus element and a second bus element, each adapted to distribute power from a power source, a third bus element adapted to distribute a control signal, wherein the first, second, and third bus elements are woven, stitched, or knitted into the support substrate; and a plurality of light emitting diode (LED) modules, each LED module comprising a microcontroller and at least one LED.

21 Claims, 28 Drawing Sheets

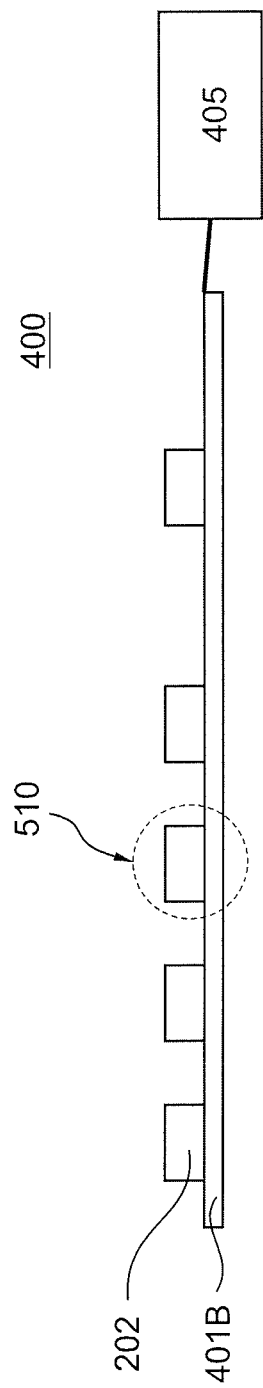
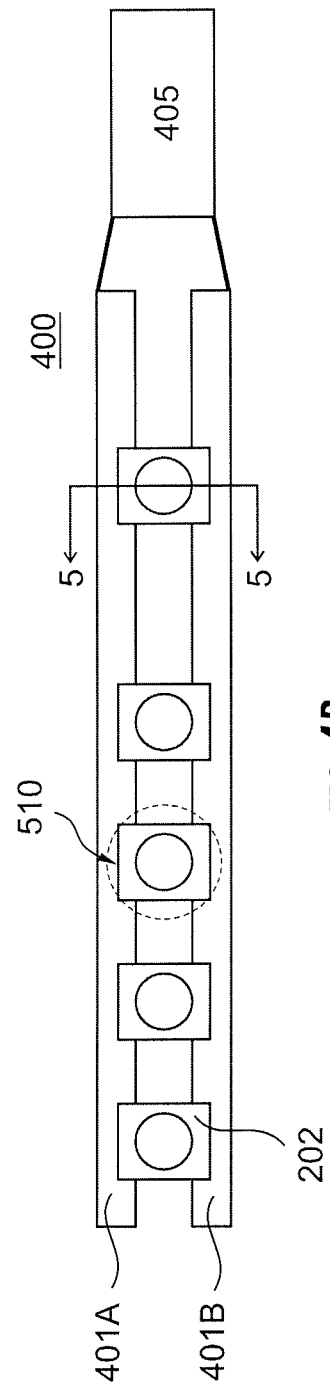
FIG. 4A
FIG. 4B

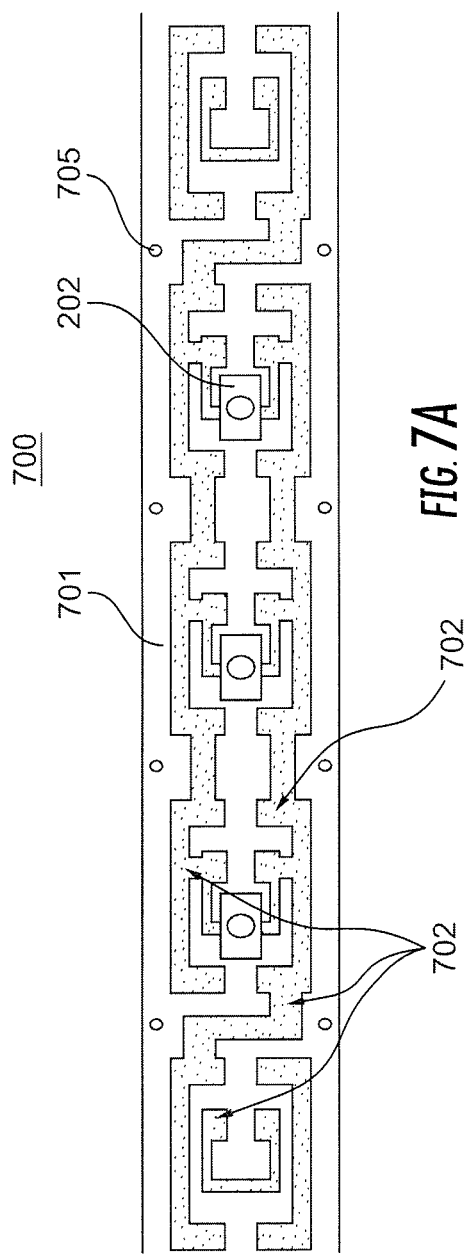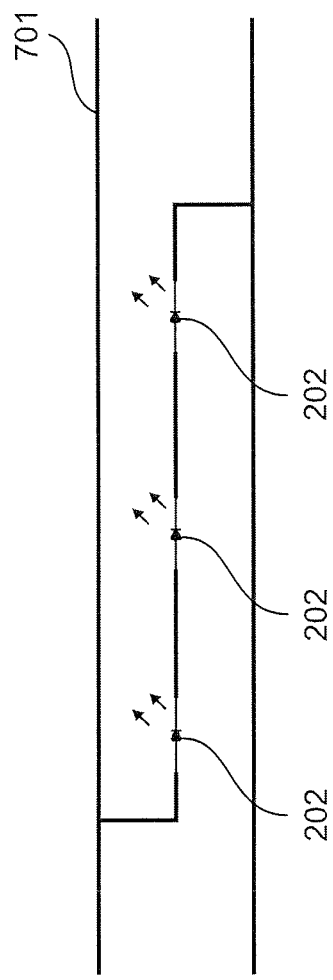

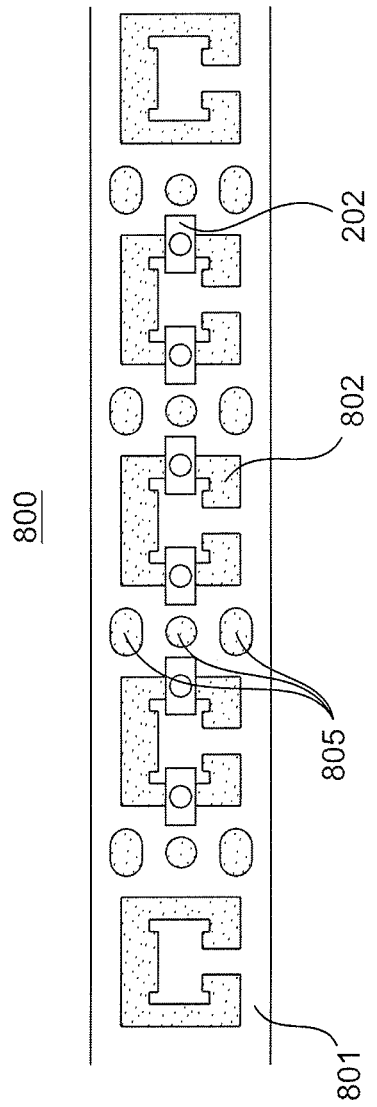
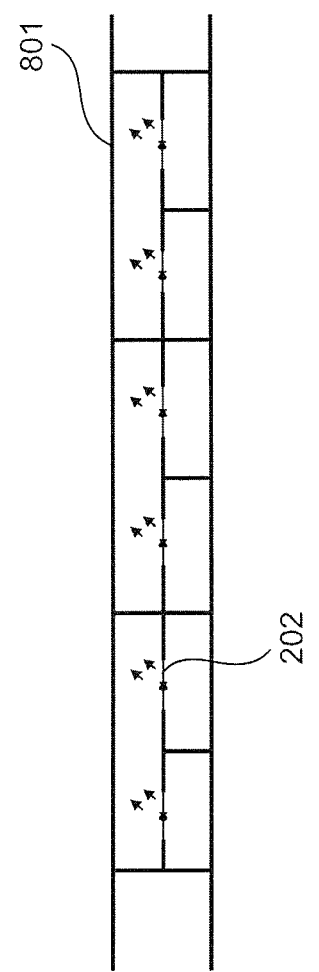
FIG. 8A
FIG. 8B

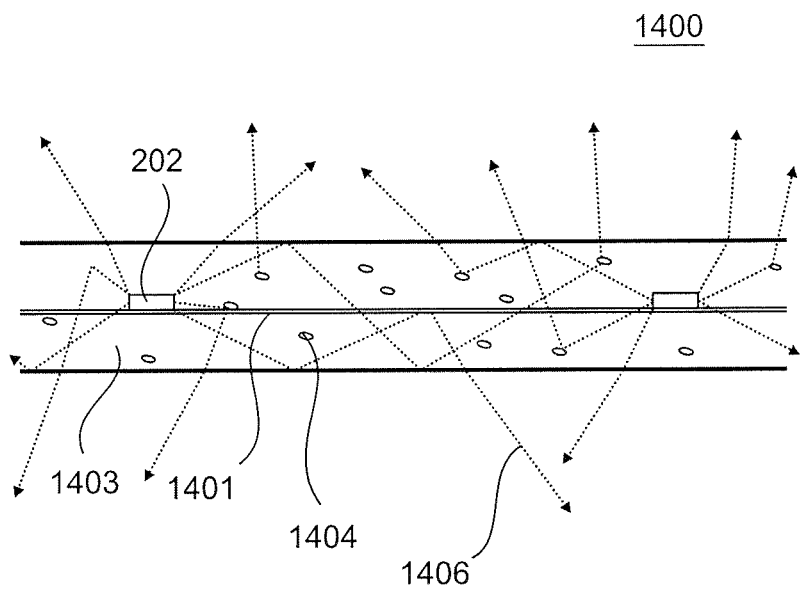
FIG. 14A
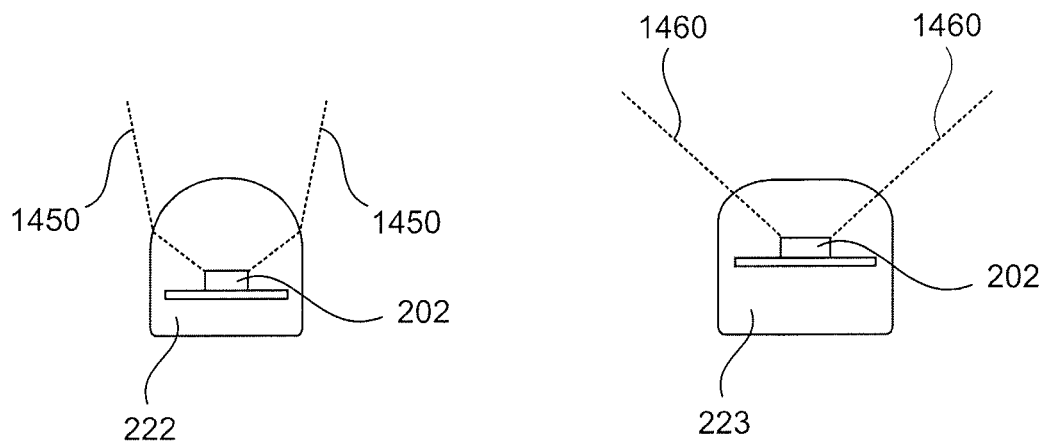
FIG. 14B
FIG. 14C

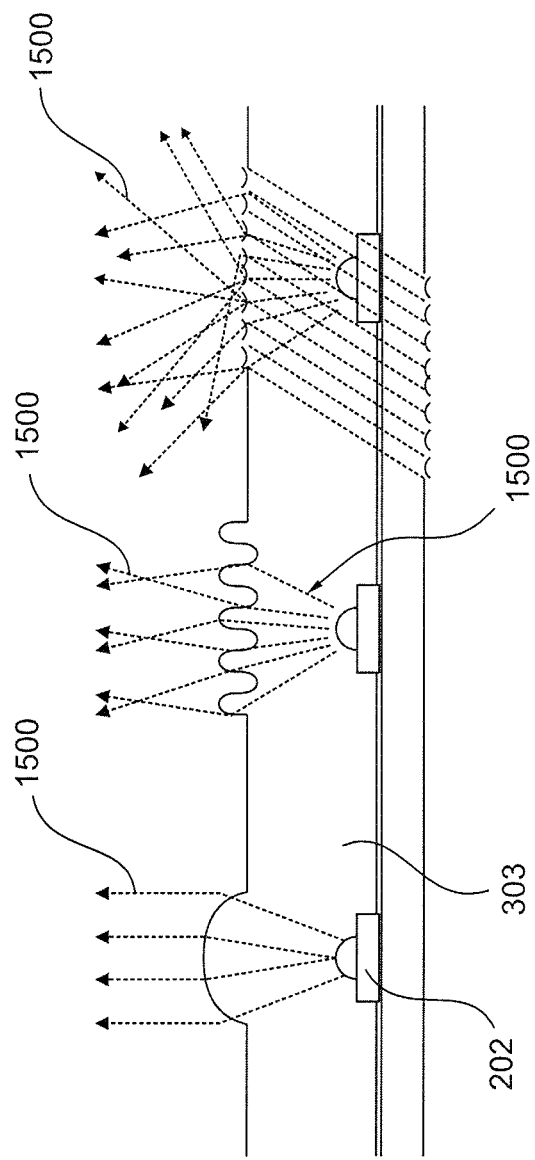

INTEGRALLY FORMED LIGHT EMITTING DIODE LIGHT WIRE AND USES THEREOF

CROSS-REFERENCE TO RELATED APPLICATIONS

This utility application is a continuation-in-part of U.S. Ser. No. 12/703,116, filed Feb. 9, 2010, now U.S. Pat. No. 8,567,992 which is a continuation-in-part of U.S. Ser. No. 12/355,655, filed Jan. 16, 2009, now U.S. Pat. No. 8,052,303, issued Nov. 8, 2011, which is a continuation-in-part of U.S. Ser. No. 11/854,145, filed Sep. 12, 2007, now U.S. Pat. No. 7,988,332, issued Aug. 2, 2011, which claims priority to U.S. Provisional Patent Application Ser. No. 60/844,184, filed Sep. 12, 2006, the entirety of which is incorporated herein by reference.

Throughout this application, several publications are referenced. Disclosure of these references in their entirety is hereby incorporated by reference into this application.

The present invention relates to light wires and, more specifically, an integrally formed light wire containing light emitting diodes ("LEDs"), and the uses of such LED light wire, wherein the LEDs and associated circuitry of the LED light wire are protected from mechanical damage and environmental hazards, such as water and dust.

BACKGROUND THE INVENTION

Conventional incandescent or LED light wires are commonly used in a variety of indoor and outdoor decorative or ornamental lighting applications. For example, such conventional light wires are used to create festive holiday signs, outline architectural structures such as buildings or harbors, and provide under-car lighting systems. These light wires are also used as emergency lighting aids to increase visibility and communication at night or when conditions, such as power outages, water immersion and smoke caused by fires and chemical fog, render normal ambient lighting insufficient for visibility.

Conventional LED light wires consume less power, exhibit a longer lifespan, are relatively inexpensive to manufacture, and are easier to install when compared to light tubes using incandescent light bulbs. Increasingly, LED light wires are used as viable replacements for neon light tubing.

As illustrated in FIG. 1, conventional light wire 100 consists of a plurality of illuminant devices 102, such as incandescent light bulbs or LEDs, connected together by a flexible wire 101 and encapsulated in a protective tube 103. A power source 105 creates an electrical current that flows through the flexible wire 101 causing the illuminant devices 102 to illuminate and create an effect of an illuminated wire. The illuminant devices 102 are connected in series, parallel, or in combination thereof. Also, the illuminant devices 102 are connected with control electronics in such a way that individual illuminant devices 102 may be selectively switched on or off to create a combination of light patterns, such as strobe, flash, chase, or pulse.

In conventional light wires, the protective tube 103 is traditionally a hollow, transparent or semi-transparent tube which houses the internal circuitry (e.g., illuminant devices 102; flexible wire 101). Since there is an air gap between the protective tube 103 and internal circuitry, the protective tube 103 provides little protection for the light wire against mechanical damage due to excessive loads, such as the weight of machinery that is directly applied to the light wire. Furthermore, the protective tube 103 does not sufficiently protect the internal circuitry from environmental hazards, such as water and dust. As a result, these conventional light wires 100 with protective tube 103 are found unsuitable for outdoor use, especially when the light wires are exposed to extreme weather and/or mechanical abuse.

In conventional light wires, wires, such as flexible wire 101, are used to connect the illuminant devices 102 together. In terms of manufacturing, these light wires are traditionally pre-assembled using soldering or crimp methods and then encapsulated via a conventional sheet or hard lamination process in protective tube 103. Such manufacturing processes are labor intensive and unreliable. Furthermore, such processes decrease the flexibility of the light wire.

In response to the above-mentioned limitations associated with conventional light wires and the manufacture thereof, LED light strips have been developed with increased complexity and protection. These LED light strips consist of circuitry including a plurality of LEDs mounted on a support substrate containing a printed circuit and connected to two separate electrical conductors or bus elements. The LED circuitry and the electrical conductors are encapsulated in a protective encapsulant without internal voids (which includes gas bubbles) or impurities, and are connected to a power source. These LED light strips are manufactured by an automated system that includes a complex LED circuit assembly process and a soft lamination process. Examples of these LED light strips and the manufacture thereof are discussed in U.S. Pat. Nos. 5,848,837, 5,927,845 and 6,673,292, all entitled "Integrally Formed Linear Light Strip With Light Emitting Diode"; U.S. Pat. No. 6,113,248, entitled "Automated System For Manufacturing An LED Light Strip Having An Integrally Formed Connected"; and U.S. Pat. No. 6,673,277, entitled "Method of Manufacturing a Light Guide".

Further, present methods of manufacturing convention light wires also require additional materials and material costs, such as the use of expensive bonding film.

Although these LED light strips are better protected from mechanical damage and environmental hazards, these LED light strips only provide one-way light direction, and are limited to two separate bus elements in its internal LED circuitry. Also, the manufacturing of such LED light strips remains expensive and time-consuming since these LED light strips at least require a protective encapsulant free of internal voids and impurities, as well as crimping each LED connector pin to the internal LED circuitry. Further, the lamination process makes these LED light strips too rigid to bend.

BRIEF SUMMARY OF THE INVENTION

In light of the above, there exists a need to further improve the art. Specifically, there is a need for an improved integrally formed LED light wire that is flexible while having increased mechanical strength, has improved electrical isolation, and provides a smooth, uniform lighting effect from all directions of the integrally formed LED light wire. There is also a need for an LED light wire with additional lighting functions which is manufactured by a low cost, time-efficient automated process which has less material cost. Furthermore, there is a need for a LED light wire which intelligently recognizes, responds and adapts to changes associated with installation, maintenance and failure detection.

In consideration of the above problems, in accordance with one aspect of the present invention, an integrally formed LED light wire, comprising (A) a conductive base comprising a support substrate, wherein the support substrate comprises a first plurality of wires, threads, or a combination thereof, wherein the plurality of wires, threads, or a combination thereof comprises at least one weft element arranged in a first direction and at least two warp elements, each arranged in a second direction such that the at least one weft element and each of the at least two warp elements form plural intersections therebetween, a first bus element formed from a second plurality of wires, threads, or a combination thereof adapted to distribute power from a power source, a second bus element formed from a third plurality of wires, threads, or a combination thereof adapted to distribute power from the power source, a third bus element formed from a fourth plurality of wires, threads, or a combination thereof adapted to distribute a control signal, wherein the first, second, and third bus elements are woven, stitched, or knitted into the support substrate; and (B) a plurality of light emitting diode (LED) modules, each of said plurality of LED modules comprising a microcontroller and at least one LED, each LED module having first, second, and third electrical contacts electrically coupled to the first, second, and third bus elements, respectively, to draw power from the first and second bus elements and to receive a control signal from the third bus elements.

In another aspect, the integrally formed LED light wire further comprises an encapsulant completely encapsulating the conductive base and the plurality of LED modules, including the respective microcontrollers.

In another aspect, the encapsulant further comprises light scattering particles.

In another aspect, the integrally formed LED light wire further comprises at least one support warp which comprises a fifth plurality of wires, threads, or a combination thereof arranged in the second direction.

In another aspect, the integrally formed LED light wire wherein a connection between each of the plurality of LED modules and at least one of the bus elements is selected from the group consisting of stitching, weaving, knitting, crimping, soldering, welding, or a combination thereof.

In another aspect, the second, third and fourth plurality of wires, threads, or a combination thereof are each made of a plurality of conductive wires and/or threads.

In another aspect, the fifth plurality of wires, threads, or a combination thereof is made of a plurality of non-conductive wires and/or threads.

In another aspect, the conductive wires and/or threads is selected from the group consisting of nickel wire, steel wire, iron wire, titanium wire, copper wire, brass wire, aluminum wire, tin wire, sliver wire, nickel thread, steel thread, iron thread, titanium thread, copper thread, brass thread, aluminum thread, tin thread, sliver thread, or the like, or a combination thereof.

In another aspect, the non-conductive wires and/or threads is selected from the group consisting of kevlar wire, nylon wire, cotton wire, rayon wire, polyester wire, laminate thread, flat thread, silk thread, glass fiber, polytetrafluoroethylene ("PTFE"), kevlar thread, nylon thread, cotton thread, rayon thread, polyester thread, a solid polymeric material, or the like, or a combination thereof.

In another aspect, each of the plurality of LED modules further comprises a plurality of LEDs, wherein the plurality of LEDs are selected from the group consisting of red, blue, green, and white LEDs.

In another aspect, each of the plurality of LED modules further comprises a fourth contact for outputting the received control signal.

In another aspect, each LED module has a unique address used to control the LED module. The unique address is static or dynamic.

In a second aspect of the present invention, an integrally formed LED light wire, comprising (A) a conductive base comprising a support substrate, wherein the support substrate comprises a first plurality of wires, threads, or a combination thereof, wherein the plurality of wires, threads, or a combination thereof comprises at least one weft element arranged in a first direction and at least two warp elements, each arranged in a second direction such that the at least one weft element and each of the at least two warp elements form plural intersections therebetween, a first, second, third, and fourth conductive bus elements, each formed from a second, third, fourth, and fifth plurality of wires, threads, or a combination thereof, respectively, wherein the first, second, third, and fourth conductive bus elements are woven, stitched, or knitted into the support substrate; and at least one conductor segment arranged between the first and second conductive bus elements, the at least one conductor segment comprising at least one LED and a sixth plurality of wires, threads, or a combination thereof, wherein the at least one conductor segment is woven, stitched, or knitted into the support substrate; and (b) at least one sensor electrically coupled to the third and fourth conductive bus elements, the third conductive bus element is adapted to transmit signals from the at least one sensor, and the fourth conductive bus is adapted to provide power to the at least one sensor.

In another aspect, the second conductive bus element is a ground and the at least one sensor is additionally electrically coupled to the second conductive bus element.

In another aspect, the integrally formed LED light wire further comprises an encapsulant completely encapsulating the conductive base, and the at least one sensor electrically coupled to the third and fourth conductive bus elements.

In another aspect, the encapsulant further comprises light scattering particles.

In another aspect, the integrally formed LED light wire wherein a connection between the at least one LED and the sixth plurality of wires is selected from the group consisting of stitching, weaving, knitting, crimping, soldering, welding, or a combination thereof.

In another aspect, the outer profile of the encapsulant comprising an alignment key and an alignment keyhole located at opposite sides of the integrally formed LED light wire.

In another aspect, a lighting panel comprising a plurality of the integrally formed LED light wires set forth herein.

BRIEF DESCRIPTION OF THE FIGURES

For the purposes of illustrating the present invention, the drawings reflect a form which is presently preferred; it being understood however, that the invention is not limited to the precise form shown by the drawings in which:

FIG. 4A is a side view of an integrally formed LED light wire according to another embodiment of the present invention;

FIG. 4B is a top view of the integrally formed LED light wire shown in FIG. 4B;

FIG. 7A is another embodiment of a conductive base;

FIG. 7B is a schematic diagram of the conductive base of FIG. 7A;

FIG. 8A is another embodiment of a conductive base;

FIG. 8B is a schematic diagram of the conductive base of FIG. 8A;

FIG. 14A depicts the optical properties of an integrally formed LED light wire according to an embodiment of the present invention;

FIG. 14B depicts a cross-sectional view of a dome-shaped encapsulant and the optical properties thereof;

FIG. 14C depicts a cross-sectional view of a flat-top-shaped encapsulant and the optical properties thereof;

FIGS. 15A-C depict a cross-sectional view of three different surface textures of the encapsulant;

DETAILED DESCRIPTION OF THE INVENTION

The present invention relates to an integrally formed LED light wire containing a plurality of LEDs that are connected in series, parallel or a combination thereof on at least one conductive bus element which forms a mounting base or on at least two conductive bus elements mounted on a support substrate made of insulating material (e.g., plastic) to provide a mounting base. The mounting base provides electrical connection and a physical mounting platform or a mechanical support for the LEDs. The mounting base can also act as or include a light reflector for the LEDs. The mounting base and LEDs are encapsulated in a transparent or semi-transparent encapsulant which may contain light scattering particles.

Figure 1:
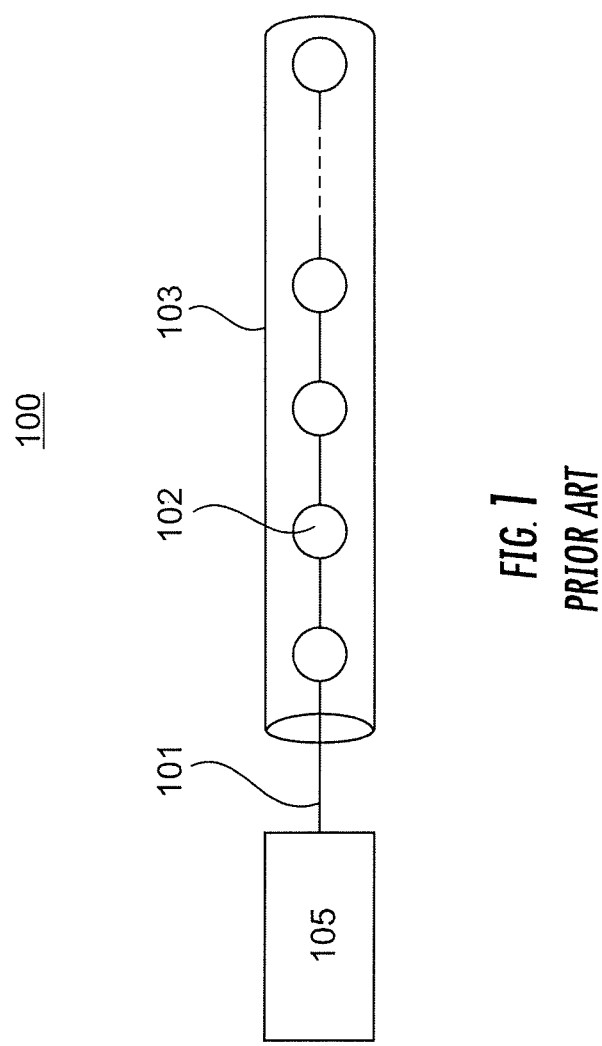
FIG. 1 is a representation of a conventional light wire.
Figure 2:
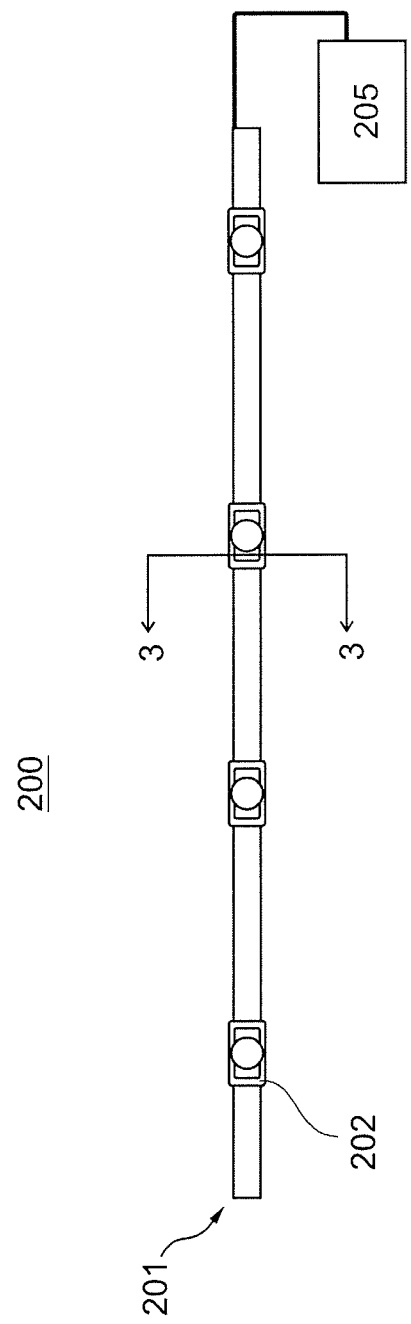
FIG. 2 is a top view illustrating an integrally formed LED light wire according to an embodiment of the present invention.
Figure 3:
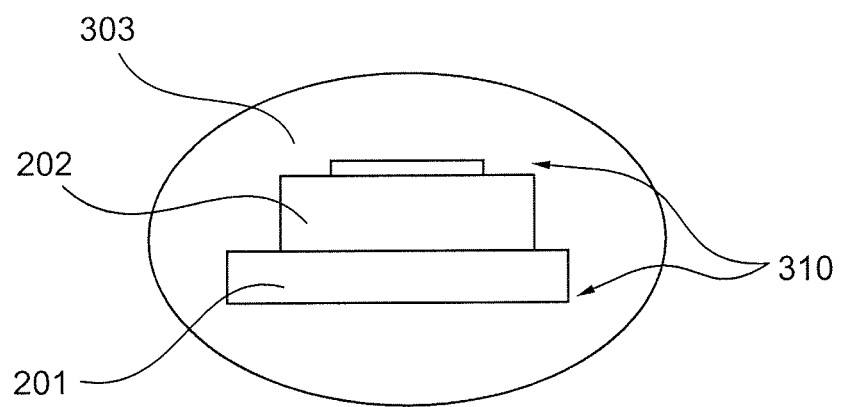
FIG. 3 is a cross-sectional view of the integrally formed LED light wire shown in FIG. 2.

In one embodiment of the present invention, as shown in FIGS. 2 and 3, an integral LED light wire, which includes a sub-assembly 310 comprising at least one LED 202 connected to a conductive base 201, the sub-assembly 310 is encapsulated within an encapsulant 303, and the conductive base 201 comprises one conductive bus element formed from a conductive material capable of distributing power from a power source. As shown in FIG. 2, the LEDs 202 are connected in series. This embodiment offers the advantage of compactness in size, and allows the production of a long, thin LED light wire with an outer diameter of 3 mm or less. The conductive base 201 is operatively connected to a power source 205 to conduct electricity.

Figure 5A:
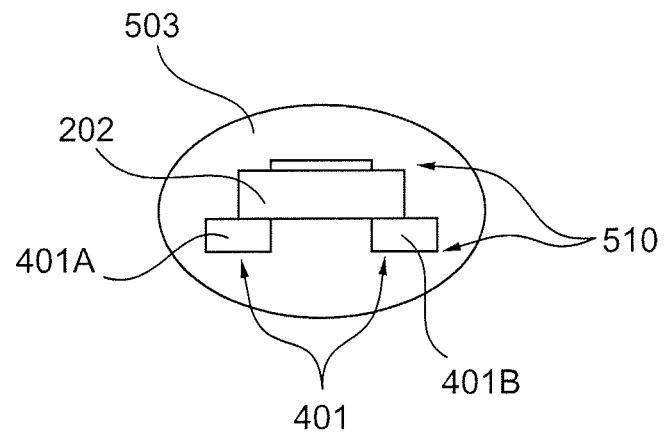
FIG. 5A is a cross-sectional view of the integrally formed LED light wire shown in FIGS. 4A & 4B.

In another embodiment, as illustrated in FIGS. 4A, 4B, and 5A, the present invention may be an integrally formed LED light wire 400 comprising a plurality of sub-assemblies 510. Each sub-assembly 510 comprises at least one LED 202 connected to a conductive base 401, wherein the conductive base 401 has two conductive bus elements 401A and 401B. The sub-assemblies 510 are encapsulated within an encapsulant 503. As shown, the LEDs 202 are connected in parallel. The conductive base 401 is operatively connected to a power source 405 to activate LEDs 202.

Figure 5B:
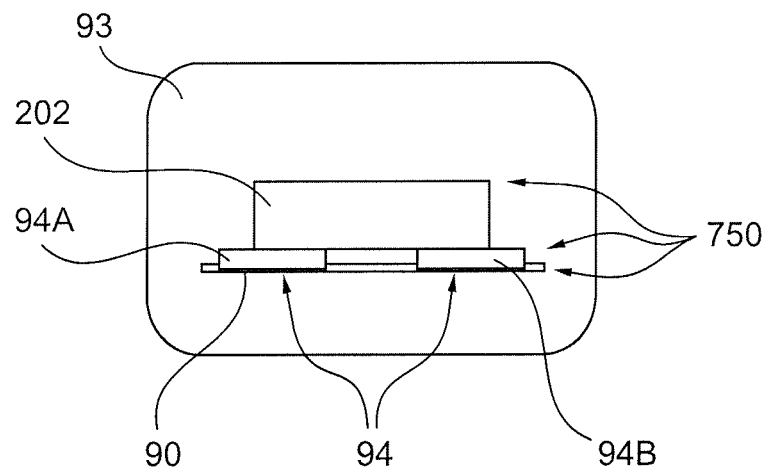
FIG. 5B is a cross-sectional view of an integrally formed LED light wire according to another embodiment of the present invention.

In another embodiment, as shown in FIG. 5B, the present invention may include a plurality of sub-assemblies 750. Each sub-assembly 750 includes at least one LED 202 (for example, a SMD-On-Board LED) connected to a conductive base 94 having at least two conductive bus elements 94A and 94B, wherein the conductive base 94 is mounted on a support substrate 90.

AC or DC power from a power source, such as power source 405, may be used to power the integrally formed LED light wire. Additionally, a current source may be used. Brightness may be controlled by digital or analog controllers.

The conductive base 94, 201, 401 extends longitudinally along the length of the integrally formed LED light wire, and act as an electrical conductor, and as a physical mounting platform or a mechanical support for the LEDs 202. The conductive base can also act as or include a light reflector for the LEDs 202.

The conductive base 201, 401 may be, for example, punched, stamped, printed, silk-screen printed, or laser cut, or the like, from a metal plate or foil to provide the basis of an electrical circuit, and may be in the form of a thin film or flat strip. The conductive bus elements of conductive base 94, 201, 401, and conductive segments (discussed below) may also be formed using rigid electrical conductive materials (such as metal rod, metal strip, copper plate, copper clad steel plate, metal strip, a rigid base material coated with an electrically conductive material, or the like), or flexible electrical conductive materials (such as thin metal strip, copper clad alloy wire, stranded wire, braided wire, or the like). Stranded wire or braided wire may be flat or round, and comprises a plurality of electrical conductive fine wires made of copper, brass, aluminum, or the like; such fine wires may be bare or coated with electrical conductive materials including, but not limited to, tin, nickel, silver, or the like. Metal, mentioned in this paragraph, may include copper, brass, aluminum, or the like.

In a preferred embodiment, flat braided wire is used as conductive bus elements or conductive segments, said conductive bus elements or conductive segments are flexible. The use of flat braided wire in the present invention promotes increased flexibility in a direction perpendicular to the length of the flat conductive bus elements. Also, flat braided wire provides higher thermal conductivity to dissipate more efficiently the heat from the LEDs, thereby allowing the present invention to operate at higher power and achieve greater brightness than conventional light wires with solid flat strips.

Also, generally speaking, the maximum length of the LED light wires is determined by the conductivity of the conductive bus elements. In conventional LED light wires, the voltage drop in the power bus increases as the LED light wires becomes longer due to its resistance and increasing current flow drawn by the increasing load of additional LEDs. Eventually, the voltage drop becomes too great at a particular maximum length of the LED light wire. In an aspect of the present invention, the maximum length of the integrally formed LED light wire can be increased by increasing the cross-sectional area of the conductive bus (e.g., increasing the gauge of braided wire used as conductive bus elements or segments), thereby reducing its resistance per unit length.

The conductive bus elements of conductive base 94 may be mounted on a support substrate 90 via adhesion, lamination, extrusion, or casting. The support substrate 90 may be made of rigid or flexible plastic, such as polyethylene terephthalate (PET), polyvinyl chloride (PVC), and thermoplastic polyurethane (TPU).

Additional circuitry, such as active or passive control circuit components (e.g., a microprocessor, a resistor, a capacitor), may be added and encapsulated within an encapsulant to add functionality to the integrally formed LED light wire. Such functionality may include, but not limited to, current limiting (e.g., resistor 10), protection, flashing capability, or brightness control. For example, a microcontroller or microprocessor may be included to make the LEDs 202 individually addressable; thereby, enabling the end user to control the illumination of selective LEDs 202 in the LED light wire to form a variety of light patterns, e.g., strobe, flash, chase, or pulse. In one embodiment, external control circuitry is connected to the conductive base 94, 201, 401.

First Embodiment of the Conductive Base

Figure 6A:
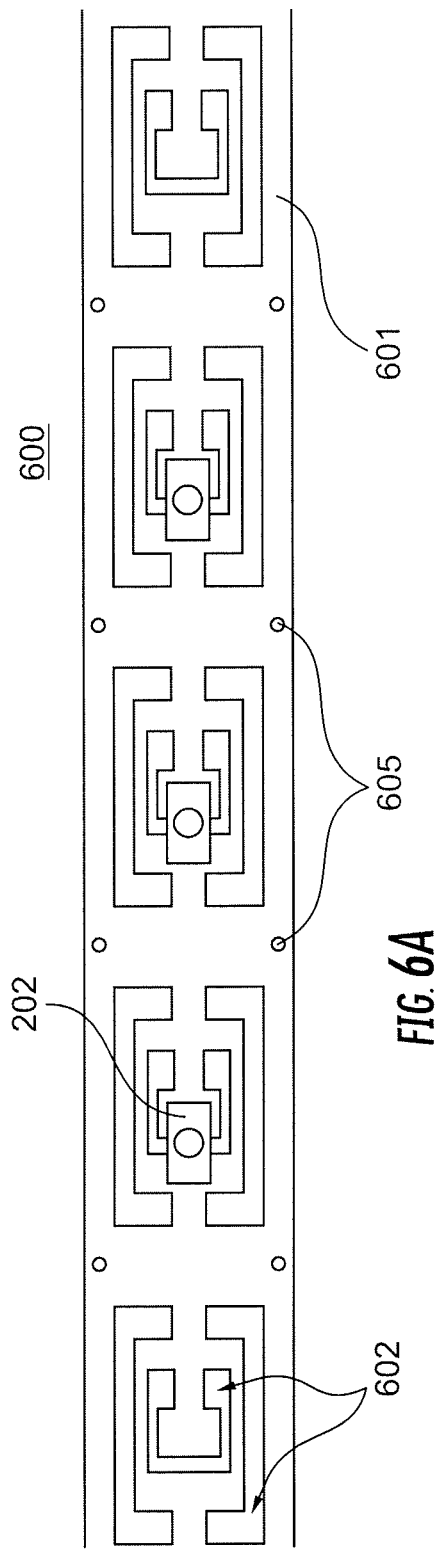
FIG. 6A is an embodiment of a conductive base.

In a first embodiment of the conductive base assembly 600, shown in FIG. 6A, the base material of the conductive base 601 is preferably a long thin narrow metal strip or foil. In one embodiment, the base material is copper. A hole pattern 602, shown as the shaded region of FIG. 6A, depict areas where material from the conductive base 601 has been removed. In one embodiment, the material has been removed by a punching machine. The remaining material of the conductive base 601 forms the circuit of the present invention. Alternatively, the circuit may be printed on the conductive base 601 and then an etching process is used to remove the areas 602. The pilot holes 605 on the conductive base 600 act as a guide for manufacture and assembly.

Figure 6B:
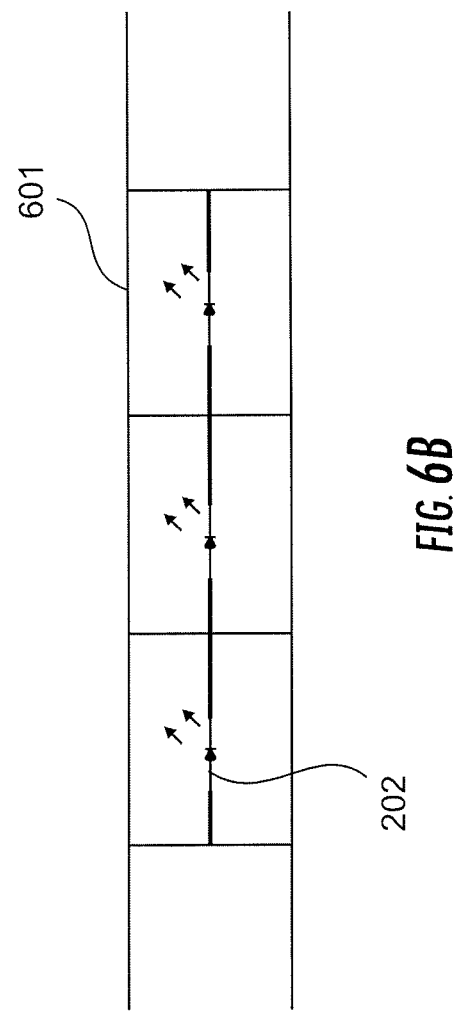
FIG. 6B is a schematic diagram of the conductive base of FIG. 6A.

The LEDs 202 are mounted either by surface mounting or LED chip bonding and soldered, welded, riveted or otherwise electrically connected to the conductive base 601 as shown in FIG. 6A. The mounting and soldering of the LEDs 202 onto the conductive base 601 not only puts the LEDs 202 into the circuit, but also uses the LEDs 202 to mechanically hold the different unpunched parts of the conductive base 601 together. In this embodiment of the conductive base 601 all of the LEDs 202 are short-circuited, as shown in FIG. 6B. Thus, additional portions of conductive base 601 are removed as discussed below so that the LEDs 202 are not short-circuited. In one embodiment, the material from the conductive base 601 is removed after the LEDs 202 are mounted.

Second Embodiment of the Conductive Base

To create series and/or parallel circuitries, additional material is removed from the conductive base. For example, additional portions of the conductive base are removed between the terminals of the LEDs 202 after the LEDs 202 are mounted on the conductive base; thereby, creating at least two conductors wherein each conductor is electrically separate, but then coupled to each other via the LEDs 202. As shown in FIG. 7A, the conductive base 701 has an alternative hole pattern 702 relative to the hole pattern 602 depicted in FIG. 6A. With the alternative hole pattern 702, the LEDs 202 (such as the three shown in FIGS. 7A and 7B) are connected in series on the conductive base 701. The series connection is shown in FIG. 7B, which is a schematic diagram of the conductive base assembly 700 shown in FIG. 7A. As shown, the mounting portions of LEDs 202 provide support for the conductive base 701.

Third Embodiment of the Conductive Base

In a third embodiment of the conductive base, as shown in FIG. 8A, a conductive base assembly 800 is depicted having a pattern 802 that is punched out or etched into the conductive base 801. Pattern 802 reduces the number of punched-out gaps required and increase the spacing between such gaps. Pilot holes 805 act as a guide for the manufacturing and assembly process. As shown in FIG. 8B, the LEDs 202 are short-circuited without the removal of additional material. In one embodiment, the material from conductive base 801 is removed after the LEDs 202 are mounted.

Fourth Embodiment of the Conductive Base

Figure 9A:
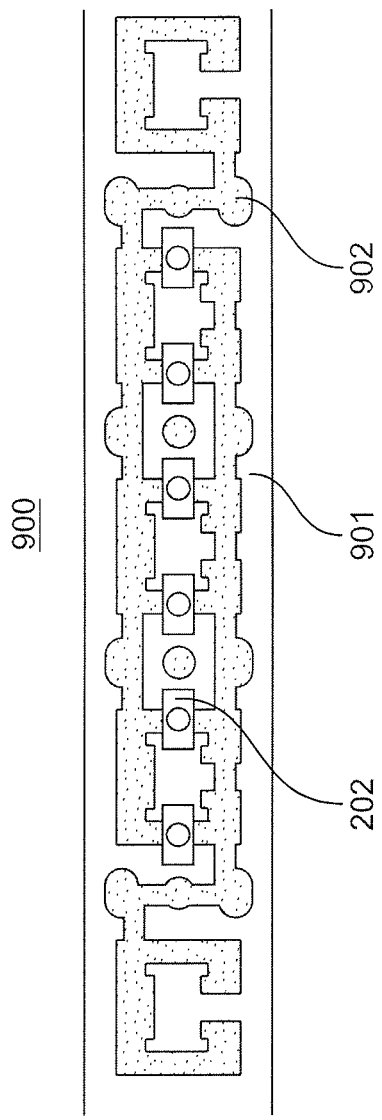
FIG. 9A is another embodiment of a conductive base.
Figure 9B:
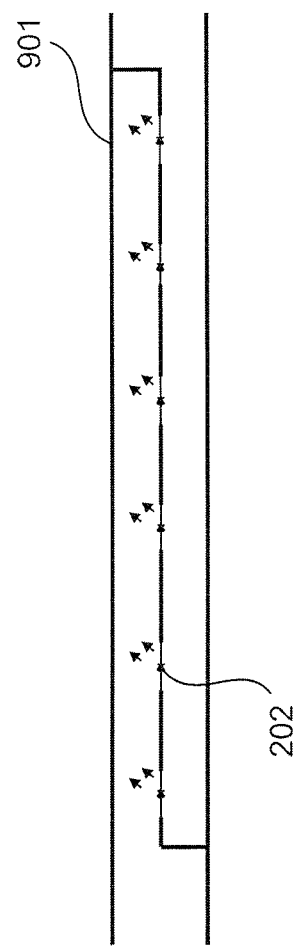
FIG. 9B is a schematic diagram of the conductive base of FIG. 9A.

As illustrated in FIG. 9A, a fourth embodiment of the conductive base assembly 900 contains an alternative hole pattern 902 that, in one embodiment, is absent of any pilot holes. Compared to the third embodiment, more gaps are punched out in order to create two conducting portions in the conductive base 901. Thus, as shown in FIG. 9B, this embodiment has a working circuit where the LEDs 202 connected in series.

Fifth and Sixth Embodiments of the Conductive Base

Figure 10A:
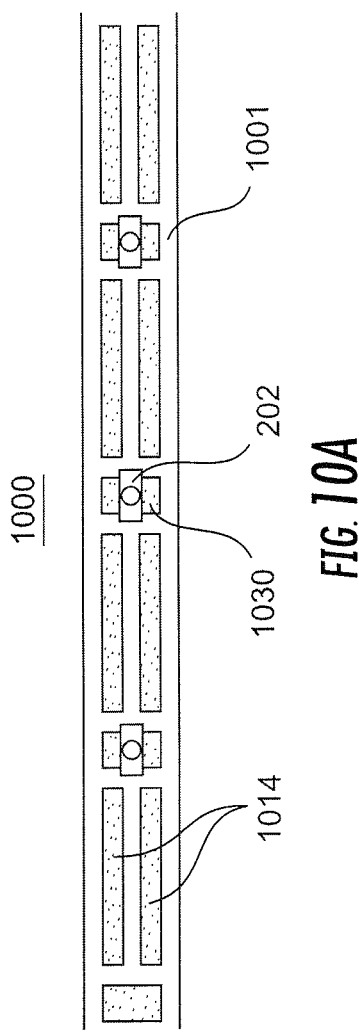
FIG. 10A is another embodiment of a conductive base.
Figure 10B:
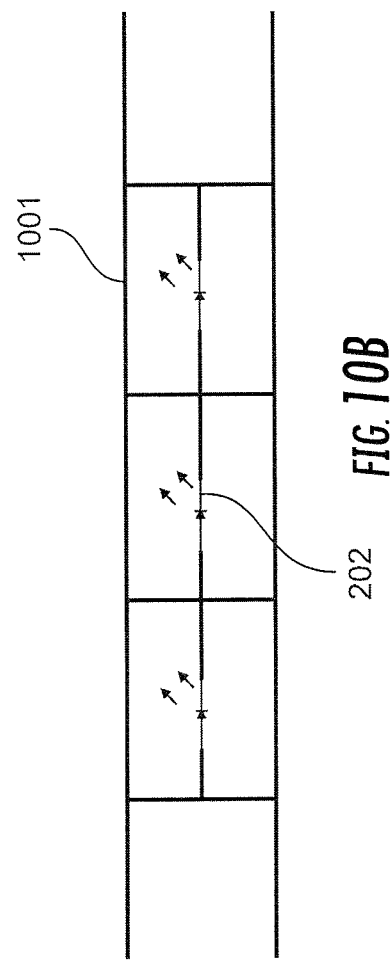
FIG. 10B is a schematic diagram of the conductive base of FIG. 10A.

FIG. 10A illustrates a fifth embodiment of conductive base assembly 1000 of the conductive base 1001. Shown is a thin LED light wire with a typical outer diameter of 3 mm or less. As shown in FIG. 10A, (1) the LEDs 202 connected on the conductive base 1001 are placed apart, preferably at a predetermined distance. In a typical application, the LEDs 202 are spaced from 3 cm to 1 m, depending upon, among other things, at least the power of the LEDs used and whether such LEDs are top or side-emitting. The conductive base 1001 is shown absent of any pilot holes. The punched-out gaps that create a first hole pattern 1014 that are straightened into long thin rectangular shapes. The gaps 1030 under the LEDs 202 are punched out after the LEDs 202 are mounted to conductive base 1001, or, in the alternative, LEDs 202 are mounted over punched-out gaps 1030. However, as shown in FIG. 10B, the resultant circuit for this embodiment is not useful since all the LEDs 202 are short-circuited. In subsequent procedures, additional material is removed from conductive base 1001 so that LEDs 202 are in series or parallel as desired.

Figure 11A:
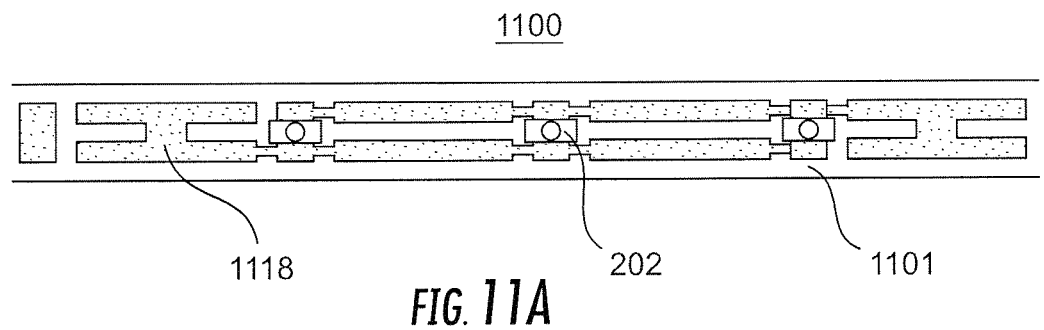
FIG. 11A is another embodiment of a conductive base.
Figure 11B:
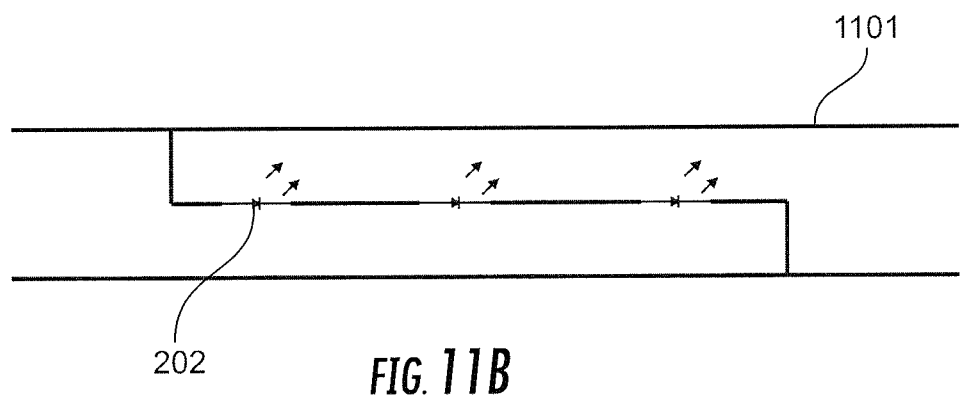
FIG. 11B is a schematic diagram of the conductive base of FIG. 11A.

In the sixth embodiment of the conductive base assembly 1100, conductive base 1101, as shown in FIG. 11A, contains a hole pattern 1118 which creates a working circuit in the conductive base 1101 with a series connections of LEDs 202 mounted onto the conductive base 1101. This embodiment is useful in creating a thin LED light wire with a typical outside diameter of 3 mm or less.

Additional Embodiments of the Conductive Base

Figure 29A:
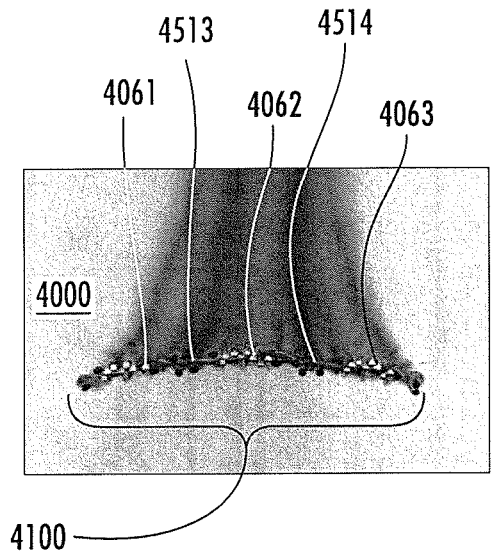
FIGS. 29A and 29B is a cross-sectional view and a top perspective view, respectively, of a conductive base of an integrally formed LED light wire according to another embodiment of the present invention.
Figure 29B:
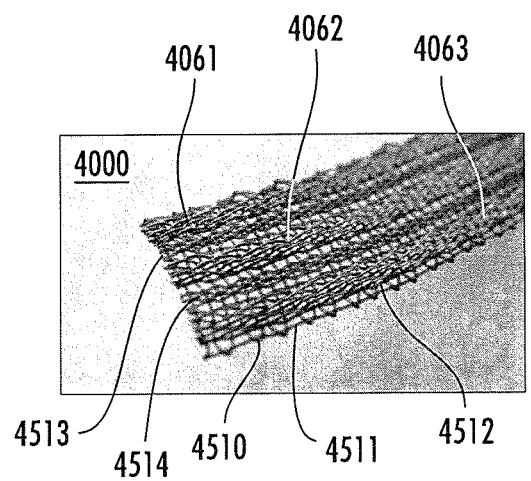

FIGS. 29A and 29B illustrate another embodiment of conductive base 4000 which is weaved and/or knitted with a plurality of wires and/or threads. As shown, the conductive base 4000 includes a support substrate 4100 containing a plurality of wires and/or threads, wherein the plurality of wires comprises at least one wire or thread as a weft element (e.g., weft element 4510) and at least two wires and/or threads as warp elements (e.g., warp elements 4511 and 4512). The conductive base 4000 can include at least one support warp (e.g., support warps 4513 and 4514) which comprises a plurality of warp elements grouped together and are in approximately parallel to one another. The support warps 4513 and 4514 provide additional mechanical strength while encouraging enhanced flexibility of the conductive base 4000.

Regarding the support substrate, the at least one weft element 4510 can be arranged in a first direction and the at least two warp elements 4511 and 4512 can be arranged in a second direction such that the weft element 4510 and each of the warp elements 4511 and 4512 form plural intersections therebetween. The weft element 4510 and each of the warp elements 4511 and 4512 can be arranged approximately perpendicular or at other angles (but not parallel) to each other at such plural intersections. The support substrate can be conductive or not conductive, and can be made with conductive and/or non-conductive wires and/or threads. Conductive wire or thread includes, but is not limited to, flexible electrical conductive material (such as copper clad allow wire, stranded wire, braided wire, or the like). Stranded wire or braided wire may be flat or round, and comprises a plurality of electrical conductive fine wires made of nickel, steel, iron, titanium, copper, brass, aluminum, or the like, or non-metal conductive such as carbon fiber, or a combination thereof; such fine wires may be bare or coated with electrical conductive materials including, but not limited to, tin, nickel, silver, or the like. A fine wire or thread made of tin, nickel, steel, titanium, silver, copper, brass, aluminum, or the like can also be used in the support substrate. Non-conductive wire or thread includes, but is not limited to, kevlar, nylon, cotton, rayon, polyester, laminate thread, flat thread, silk thread, glass fiber, polytetrafluoroethylene ("PTFE"), any solid polymeric material, or the like, or a combination thereof.

In addition to a support substrate, the conductive base 4000 includes conductive bus elements 4061, 4062, and 4063, wherein the conductive bus elements each comprises a plurality of wires, wherein the plurality of wires comprises at least one wire or thread that is weaved and/or knitted into the support substrate. The conductive bus elements can be adapted in the following manner: a first conductive bus element 4061 can be adapted to distributed power from a power source; a second conductive bus element 4062 can be adapted to distributed a control signal; and a third conductive bus element 4063 can be adapted as a ground. However, the adaptations listed above can be changed between the conductive bus elements. The conductive base 4000 also include more than three conductive bus elements.

Electronic components, such as LEDs, resistors, diodes, transistors, fuses, or any integrated circuits can be directly mounted on the conductive base 4000, or can be pre-assembled on a printed circuit board (e.g., rigid PCB or flexible PCB) and then the printed circuit board can be mounted on the conductive base 4000. Mounting methods includes, but not limited to, soldering, welding, crimping, stitching, weaving, knitting, or a combination thereof.

Conductive base 4000 can be constructed by hand, a weaving machine and/or a knitting machine. Since the components of this embodiment are mainly made of a plurality of wires and/or thread, manufacturing of this embodiment requires a decreased number of different components, which in turn present decreased material costs and increased environmental-friendly manufacturing processes. In addition, the flexibility of the embodiment provides versatility in creating organic form factors, and it can take on the personality of paper and/or fabric. For example, the embodiment can be used to create LED lighting wallpaper or LED clothing.

Figure 30:
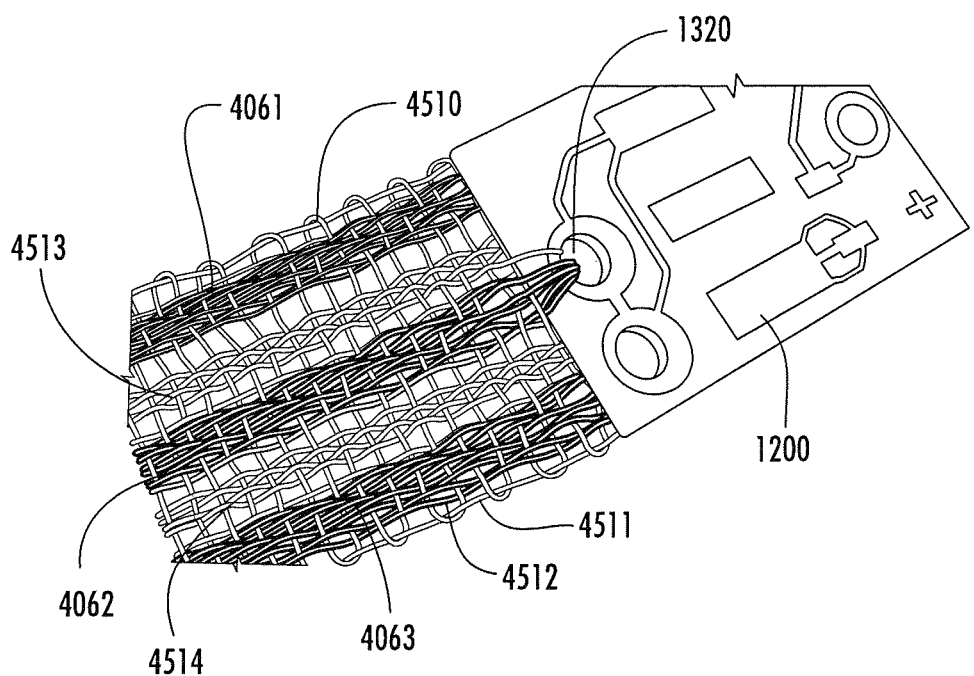
FIG. 30 is a top perspective view of the integrally formed LED light wire of FIGS. 29A and 29B with a PCB electrically connected via stitching to the conductive base.
Figure 31A:
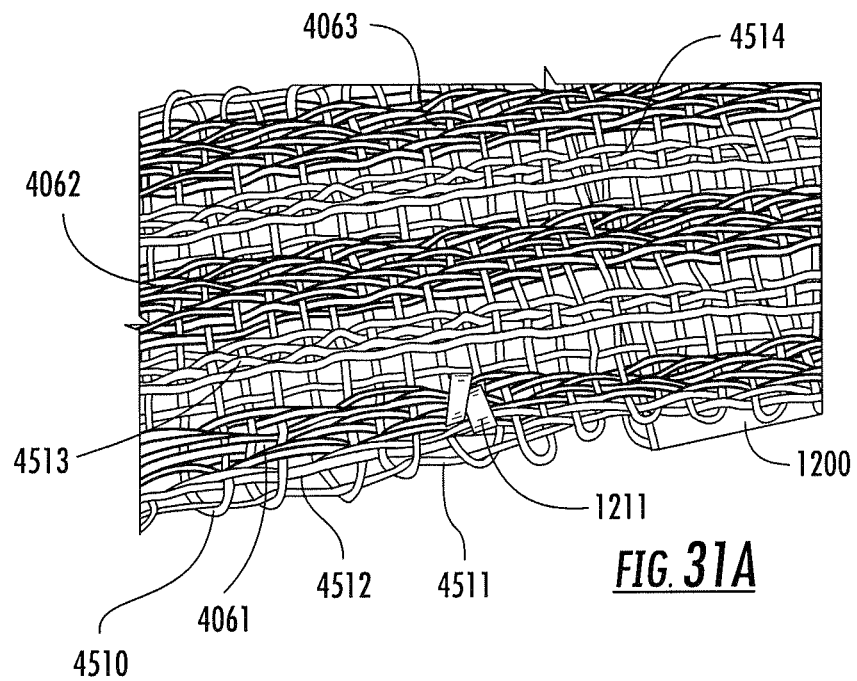
FIGS. 31A and 31B is a bottom perspective view and a top perspective view, respectively, of the integrally formed LED light wire of FIGS. 29A and 29B with an LED electrically connected via crimping to the conductive base.
Figure 31B:
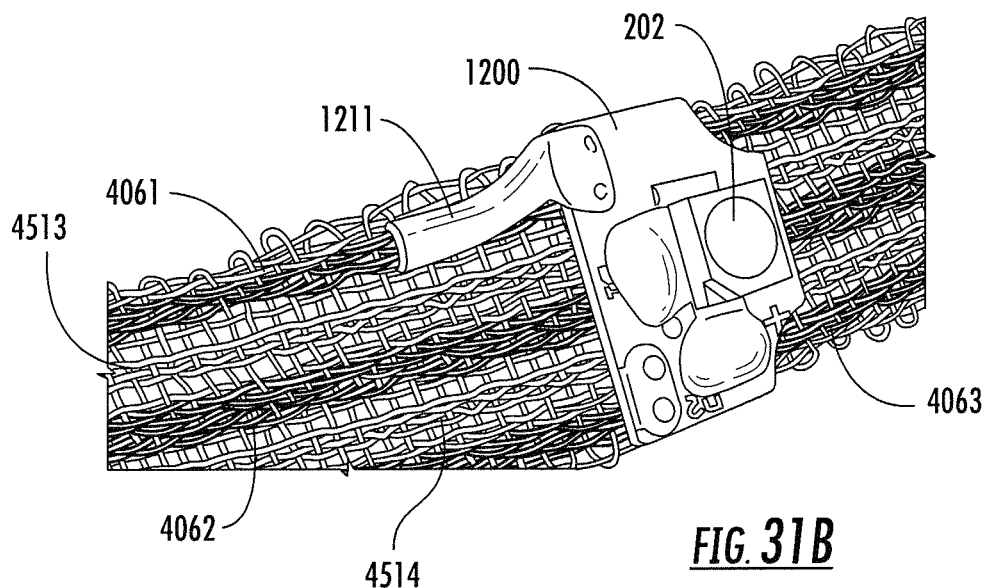

As shown in FIGS. 30, 31A & 31B, LED 202 can be mounted onto the conductive base 4000 by soldering, welding, crimping, stitching, weaving, knitting, or a combination thereof. For example, LED 202 can be electrically connected to at least one of the conductive bus elements 4061, 4062, 4063 by stitching, weaving, and/or knitting with at least a conductive wire or thread, or by crimping. The LED 202 can also be soldered onto at least one of the bus elements 4061, 4062, 4063 of the conductive base 4000.

This embodiment of the conductive base 4000 can be used in all embodiments of the integrally formed LED light wire disclosed in this application.

LEDs

The LEDs 202 may be, but are not limited to, individually-packaged LEDs, chip-on-board ("COB") LEDs, leaded LEDs, surface mount LEDs, SMD-On-Board LEDs, or LED dies individually die-bonded to the conductive base 301. The PCB for COB LEDs and SMD-On-Board LEDs may be, for example, FR4 PCB, flexible PCB, or metal-core PCB. The LEDs 202 may also be top-emitting LEDs, side-emitting LEDs, or a combination thereof.

The LEDs 202 are not limited to single colored LEDs. Multiple-colored LEDs may also be used. For example, if Red/Blue/Green LEDs (RGB LEDs) are used to create a pixel, combined with a variable luminance control, the colors at each pixel can combine to form a range of colors.

Mounting of LEDs onto the Conductive Base

As indicated above, LEDs 202 are mounted onto the conductive base by methods known in the art, including surface mounting, LED chip bonding, spot welding and laser welding.

Figure 12A:
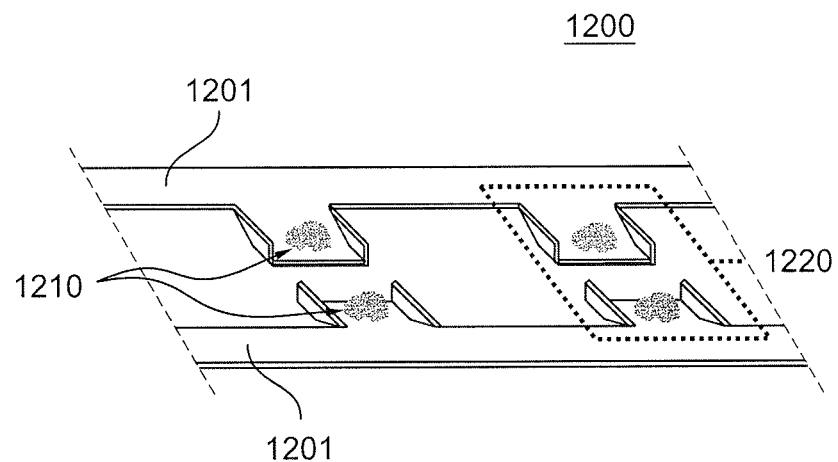
FIG. 12A depicts an embodiment of an LED mounting area of a conductive base.
Figure 12B:
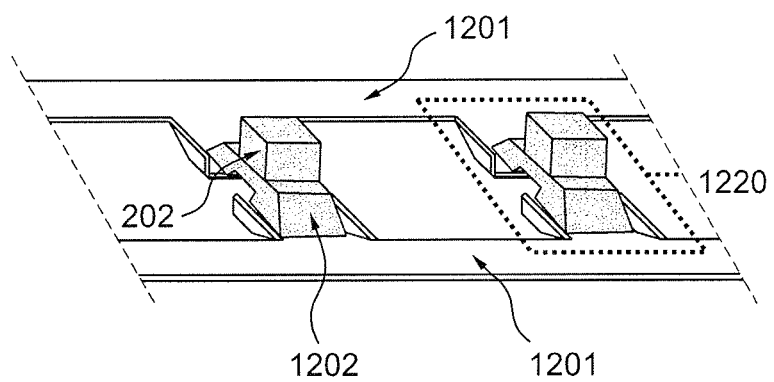
FIG. 12B depicts an LED mounted on the LED mounting area shown in FIG. 12A.

In surface mounting, as shown in FIGS. 12A and 12B, the conductive base 1201 is first punched to assume any one of the embodiments discussed above, and then stamped to create an LED mounting area 1210. The LED mounting area 1210 shown is exemplary, and other variations of the LED mounting area 1210 are possible. For example, the LED mounting area 1210 may be stamped into any shape which can hold an LED 202, or not stamped.

A soldering material 1210 (e.g., liquid solder; solder cream; solder paste; and any other soldering material known in the art) or conductive epoxy is placed either manually or by a programmable assembly system in the LED mounting area 1220, as illustrated in FIG. 12A. LEDs 202 are then placed either manually or by a programmable pick and place station on top of the soldering material 1210 or a suitable conductive epoxy. The conductive base 1201 with a plurality of LEDs 202 individually mounted on top of the soldering material 1210 may directly go into a programmable reflow chamber where the soldering material 1210 is melted or a curing oven where the conductive epoxy is cured. As a result, the LEDs 202 are bonded to the conductive base 1201 as shown in FIG. 12B.

Figure 13:
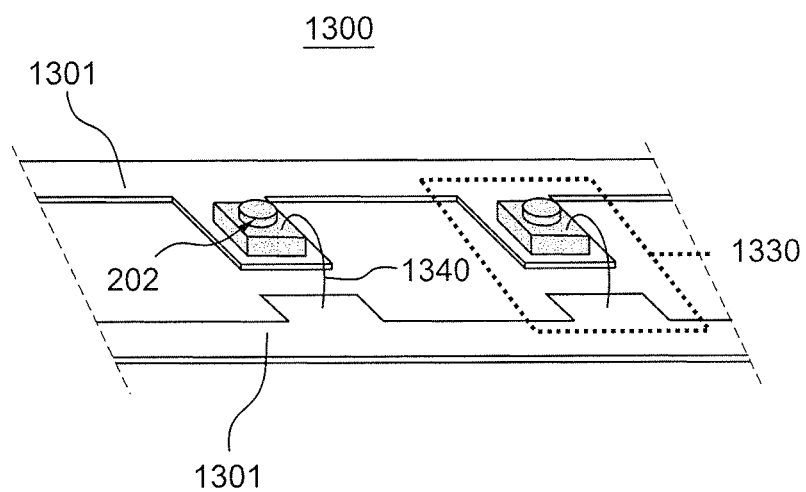
FIG. 13 depicts LED chip bonding in another embodiment of an LED mounting area.

As illustrated in FIG. 13, LEDs 202 may be mounted onto the conductive base 1301 by LED chip bonding. The conductive base 1301 is stamped to create a LED mounting area 1330. The LED mounting area 1330 shown in FIG. 13 is exemplary, and other variations of the LED mounting area 1330, including stamped shapes, like the one shown in FIG. 12A, which can hold an LED, are envisioned. LEDs 202, preferably an LED chip, are placed either manually or by a programmable LED pick place machine onto the LED mounting area 1330. The LEDs 202 are then wire bonded onto the conductive base 1301 using a wire 1340. It should be noted that wire bonding includes ball bonding, wedge bonding, and the like. Alternatively, LEDs 202 may be mounted onto the conductive base 301 using a conductive glue or a clamp.

As stated above, as shown in FIGS. 30, 31A & 31B, LED 202 can be mounted onto the conductive base 4000 by stitching, weaving, knitting or crimping. For example, LED 202 can be electrically connected to at least one of the conductive bus elements 4061, 4062, 4063 by stitching, weaving, and/or knitting with at least a conductive wire or thread, or by crimping. The LED 202 can also be soldered or welded onto at least one of the conductive bus elements 4061, 4062, 4063 of the conductive base 4000. By way of example, as shown in FIG. 30, the PCB 1200 (which would have a LED 202 electrically connected thereto) has at least one eyelet 1320 where at least a conductive wire or thread can be threaded through the at least one eyelet 1320 and stitched, weaved, and/or knitted into at least one of conductive bus elements of the conductive base 4000 to create an electrical connection between the LED 202 and the conductive base 4000. In another example as depicted in FIGS. 31A-31B, the LED 202 is electrically connected to PCB 1200 which has a crimping arm 1211, the crimping arm 1211 is electrically connected to first conductive bus 4061.

It should be noted that the conductive base in the above embodiments can be twisted in an "S" shape. Then, the twisting is reversed in the opposite direction for another predetermined number of rotations; thereby, making the conductive base form a shape of a "Z". This "S-Z" twisted conductive base is then covered by an encapsulant. With its "S-Z" twisted placement, this embodiment will have increased flexibility, as well as emit light uniformly over 360°.

Figure 11C:
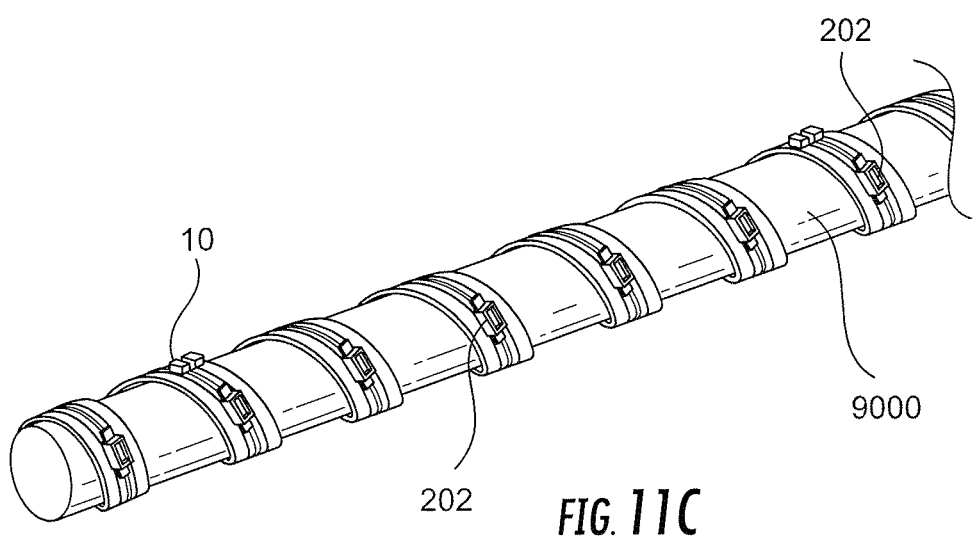
FIG. 11C depicts an embodiment of a conductive base wrapped on a core prior to encapsulation.

In another embodiment, as shown in FIG. 11C, conductive base (e.g., conductive base 1101) delivering electrical current to the LEDs is wound into spirals. The spiraling process can be carried out by a conventional spiraling machine, where the conductive base is placed on a rotating table and a core 9000 passes through a hole in the center of the table. The pitch of the LED is determined by the ratio of the rotation speed and linear speed of the spiraled assembly. The core 9000 may be in any three-dimensional shape, such as a cylinder, a rectangular prism, a cube, a cone, a triangular prism, and may be made of, but not limited to, polymeric materials such as polyvinyl chloride (PVC), polystyrene, ethylene vinyl acetate (EVA), polymethylmethacrylate (PMMA) or the like, or, in one embodiment, elastomer materials such as silicon rubber. The core 9000 may also be solid. In one embodiment, the conductive base delivering electrical current to the LEDs is wound into spirals on a solid plastic core and then encapsulated in a transparent elastomer encapsulant.

Encapsulant

The encapsulant provides protection against environmental elements, such as water and dust, and damage due to loads placed on the integral LED light wire. The encapsulant may be flexible or rigid, and transparent, semi-transparent, opaque, and/or colored. The encapsulant may be made of, but not limited to, polymeric materials such as polyvinyl chloride (PVC), polystyrene, ethylene vinyl acetate (EVA), polymethylmethacrylate (PMMA) or other similar materials or, in one embodiment, elastomer materials such as silicon rubber.

Fabrication techniques concerning the encapsulant include, without limitation, extrusion, casting, molding, laminating, injection molding, or a combination thereof.

In addition to its protective properties, the encapsulant can assist in the scattering and guiding of light in the LED light wire. As illustrated in FIG. 14, that part of the light from the LEDs 202 which satisfies the total internal reflection condition will be reflected on the surface of the encapsulant 1403 and transmitted longitudinally along the encapsulant 1403. Light scattering particles 1404 may be included in the encapsulant 1403 to redirect such parts of the light as shown by light path 1406, as well as attenuate or eliminate hot spots of light. The light scattering particles 1404 are of a size chosen for the wavelength of the light emitted from the LEDs. In a typical application, the light scattering particles 1404 have a diameter in the scale of nanometers and they can be added to the polymer either before or during the extrusion process. Further, as shown in FIG. 14A, conductive base 1401 can also act as or include a light reflector within the LED light wire.

The light scattering particles 1404 may also be a chemical by-product associated with the preparation of the encapsulant 1403. Any material that has a particle size (e.g., a diameter in the scale of nanometers) which permits light to scatter in a forward direction can be a light scattering particle.

The concentration of the light scattering particles 1404 is varied by adding or removing the particles. For example, the light scattering particles 1404 may be in the form of a dopant added to the starting material(s) before or during the extrusion process. Also, air bubbles or any other internal voids may be used as a light scattering particle 1404. The concentration of the light scattering material 1404 within the encapsulant 1403 is influenced by the distance between LEDs, the brightness of the LEDs, and the uniformity of the light. A higher concentration of light scattering material 1404 may increase the distance between neighboring LEDs 202 within the LED light wire. The brightness of the LED light wire may be increased by employing a high concentration of light scattering material 1404 together within closer spacing of the LEDs 202 and/or using brighter LEDs 202. The smoothness and uniformity of the light within the LED light wire can be improved by increasing the concentration of light scattering material 1404 may increase such smoothness and uniformity.

As shown in FIGS. 3, 5A and 5B, the sub-assemblies 310, 510 and 750 are substantially at the center of the encapsulant. The sub-assemblies 310, 510 and 750 are not limited to this location within the encapsulant. The sub-assemblies 310, 510 and 750 may be located anywhere within the encapsulant. Additionally, the cross-sectional profile of the encapsulant is not restricted to circular or oval shapes, and may be any shape (e.g., square, rectangular, trapezoidal, star). Also, the cross-sectional profile of the encapsulant may be optimized to provide either a narrow or wide viewing angle (see light paths 1450 and 1460 in FIGS. 14B (dome-shaped profile of encapsulant 222) and 14C (flat-top profile of encapsulant 223), respectively) and/or lensing for light emitted by the LEDs 202. For example, another thin layer of encapsulant may be added outside the original encapsulant to further control the uniformity of the emitted light from the present invention.

Surface Texturing and Lensing

The surface of the integral LED light wire can be textured and/or lensed for optical effects. The integral LED light wire may be coated (e.g., with a fluorescent material), or include additional layers to control the optical properties (e.g., the diffusion and consistency of illuminance) of the LED light wire. Additionally, a mask may be applied to the outside of the encapsulant to provide different textures or patterns.

Different design shapes or patterns may also be created at the surface of the encapsulant by means of hot embossing, stamping, printing and/or cutting techniques to provide special functions such as lensing, focusing, and/or scattering effects. As shown in FIGS. 15A-C, the present invention includes formal or organic shapes or patterns (e.g., dome, waves, ridges) which influences light rays 1500 to collimate (FIG. 15A), focus (FIG. 15B), or scatter/diffuse (FIG. 15C). The surface of the encapsulant may be textured or stamped during or following extrusion to create additional lensing. Additionally, the encapsulant 93, 303 and 503 may be made with multiple layers of different refractive index materials in order to control the degree of diffusion.

Applications of Integrally Formed LED Light Wire

The present invention of the integrally formed LED light wire finds many lighting applications. The following are some examples such as LED light wires with 360° Illumination, full color LED light wires, LED light wires with sensor or detectors, and LED light wires with individually controlled LEDs. Also, the LED light wires may aligned side-by-side or stacked in order to create a lighting panel. It should be noted that these are only some of the possible light wire applications.

Figure 16A:
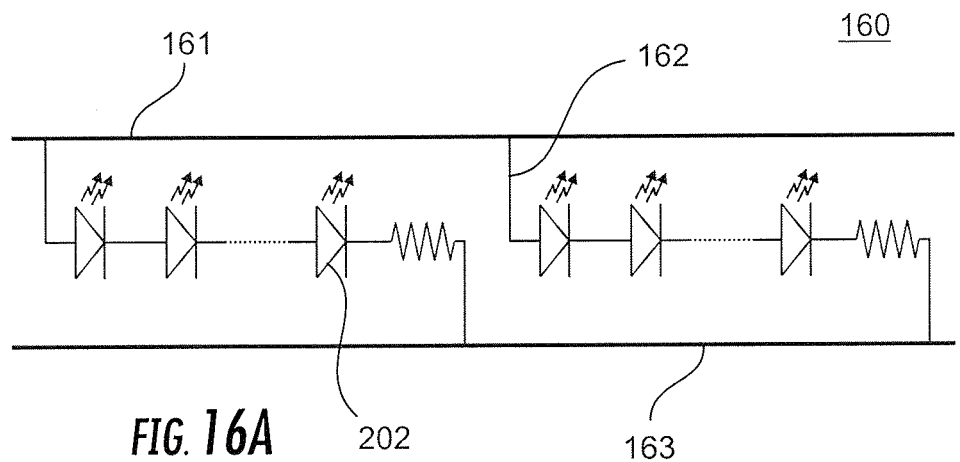
FIG. 16A is a schematic diagram of an integrally formed LED light wire according to an embodiment of the present invention.
Figure 16B:
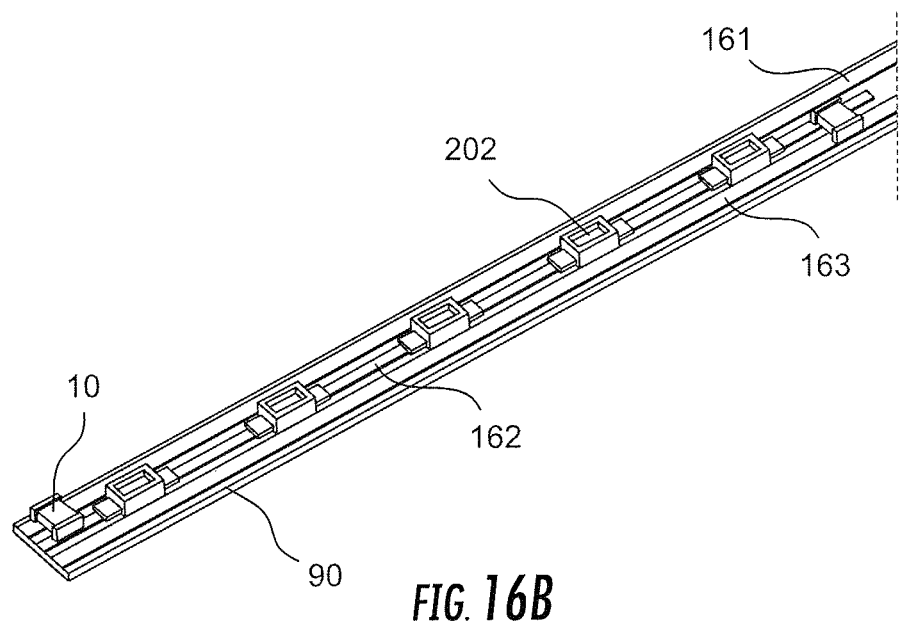
FIG. 16B depicts an embodiment of the integrally formed LED light wire shown in FIG. 16A.

The three copper wires 161, 162, 163 delivering electrical power to the LEDs 202 shown in FIG. 16B forming the conductive base may be wound into spirals (see FIG. 11C). The LEDs are connected to the conductors by soldering, ultrasonic welding or resistance welding. Each neighboring LED can be orientated at the same angle or be orientated at different angles. For example, one LED is facing the front, the next LED is facing the top, the third LED is facing the back, and the fourth one is facing the bottom etc. Thus, the integrally formed LED light wire can illuminate the whole surrounding in 360°.

Figure 16C:
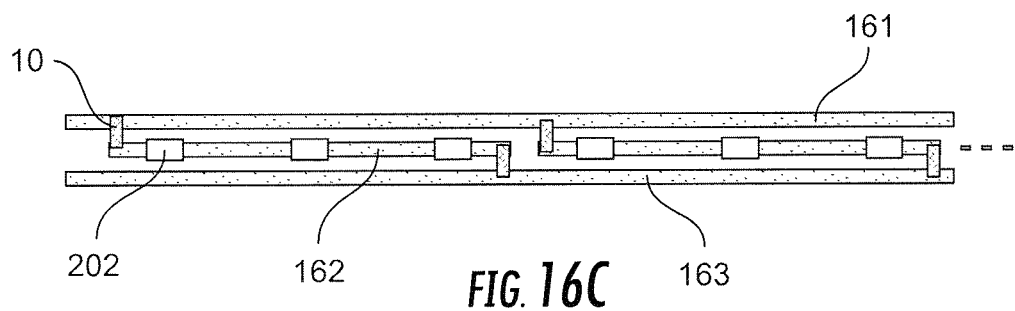
FIG. 16C is a block diagram illustrating the integrally formed LED light wire shown in FIG. 16B.

An embodiment of the integrally formed LED light wire is shown in FIGS. 16B and 16C. As shown, there are two continuous conductors identified as conductive bus elements 161 and 163. Zero ohm jumpers or resistors 10 couple conductor segments 162 to conductive bus elements 161 and 163 to provide power to LED elements 202. As shown in FIG. 16B, conductive bus elements 161 and 163 are mounted on a support substrate 90. In a preferred embodiment, the conductive bus elements 161 and 163 and support substrate 90 are flexible. In another embodiment, the LED light wire with flexible support substrate is wound in spirals about a core 9000 (see, for example, FIG. 11C), and then is encapsulated in an encapsulant.

Another embodiment of the integrally formed LED light wire is shown in FIG. 30 with conductive base 4000. As shown, there is a conductive base 4000 which includes a support substrate 4100 containing a plurality of wires and/or threads, wherein the plurality of wires comprises at least one wire or thread as a weft element (e.g., weft element 4510) and at least two wires and/or threads as warp elements (e.g., warp elements 4511 and 4512). In this exemplary embodiment, there are conductive bus elements 4061, 4062, and 4063, wherein each conductive bus element are can be formed from a plurality of wires and/or threads. The conductive base 4000 has support warps 4513 and 4514. The conductive base 4000 can have one or more conductive bus elements and/or one or more support warps. PCB 1200 (which has LED 202 electrically connected thereto) has at least one eyelet 1320 wherein at least a conductive wire or thread can be threaded through the at least one eyelet 1320 and stitched, weaved, and/or knitted into at least one of the bus elements of the conductive base 4000 to create an electrical connection between the LED 202 and the conductive base 4000. Here, PCB 1200 is stitched to second bus element 4062, and thereby creating an electrical connection between the LED 202 and the conductive base 4000.

Another embodiment of the LED light wire is shown in FIGS. 31A and 31B. In this exemplary embodiment, the LED 202 is electrically connected to PCB 1200, wherein PCB 1200 has a crimping arm 1211, and the crimping arm 1211 is electrically connected to conductive bus element 4061.

Figure 20:
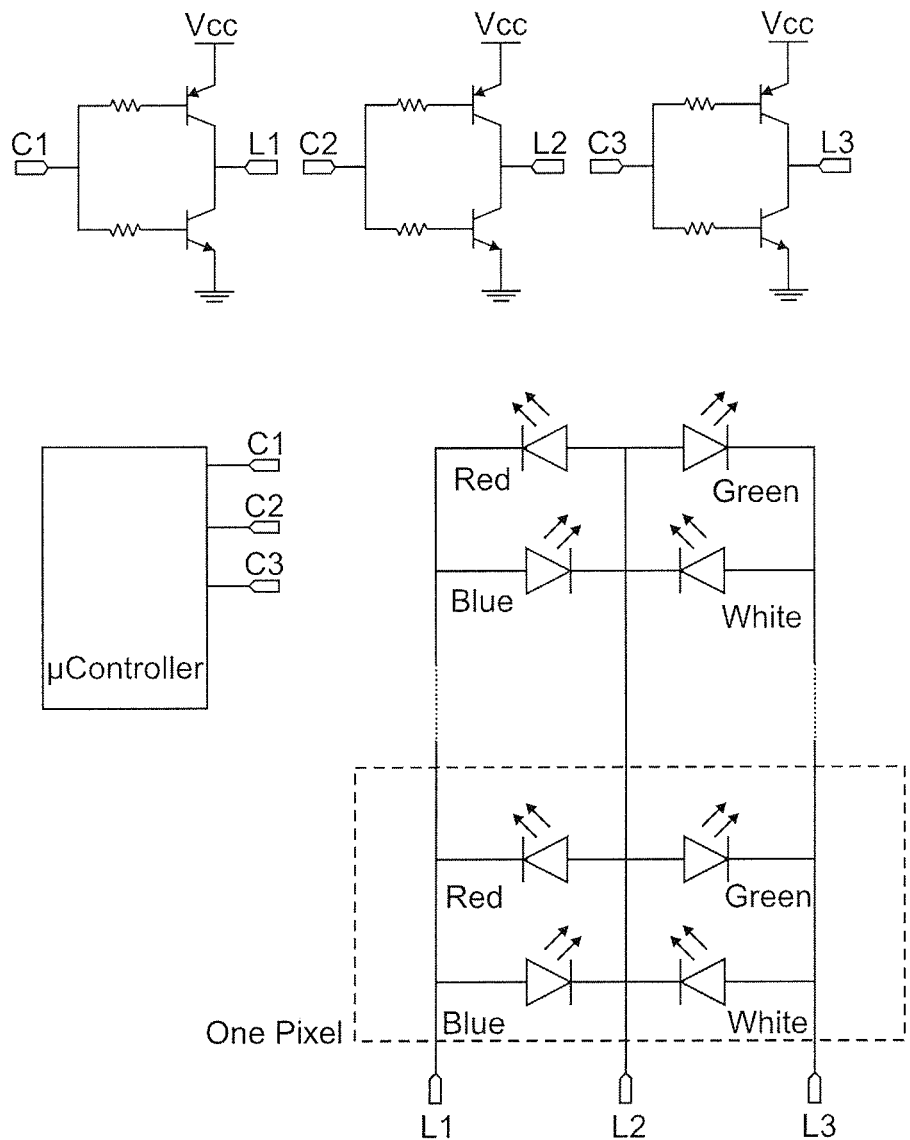
FIG. 20 is a schematic diagram of a control circuit for a full color integrally formed LED light wire.

The integrally formed LED light wire is not limited to single color. For full color application, the single color LED is replaced by multiple LEDs or an LED group consisting of four sub-LEDs in four different colors: red, blue, green, and white as shown in FIG. 20. The intensity of each LED group (one pixel) can be controlled by adjusting the voltage applied across each sub-LED. The intensity of each LED is controlled by a circuit such as the one shown in FIG. 20.

In FIGS. 20, L1, L2, and L3 are the three signal wires for supplying electric powers to the four LEDs in each pixel. The color intensity of each sub-LED is controlled by a μController 6000 with the timing chart given in FIG. 21.

Figure 21:
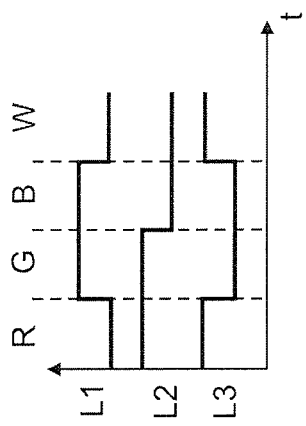
FIG. 21 is a timing diagram for a full color integrally formed LED light wire.

As shown in FIG. 21, because the line voltage L2 is higher than the line voltage L1 over the first segment of time, the red LED (R) is turned on, whereas, during the same time interval, all the other LEDs are reverse biased and hence they are turned off. Similarly, in the second time interval, L2 is higher than L3 thus turning on the green LED (G) and turning off all the other LEDs. The turning on/off of other LEDs in subsequent time segments follows the same reasoning.

Figure 22B:
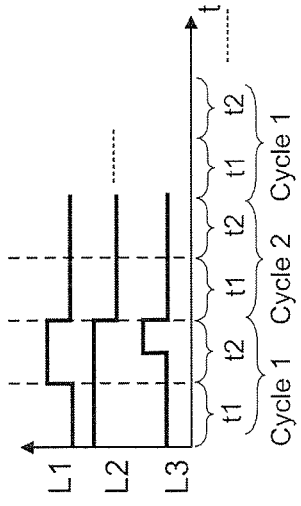
FIG. 22B is a timing diagram for a full color integrally formed LED light wire.
Figure 22A:
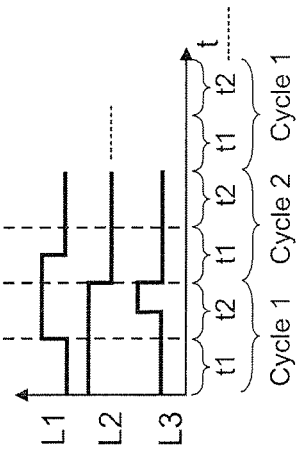
FIG. 22A is a timing diagram for a full color integrally formed LED light wire.
Figure 23:
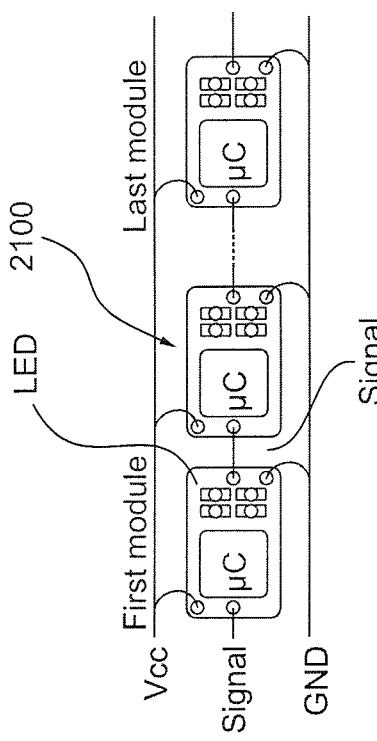
FIG. 23 is a schematic diagram of an integrally formed LED light wire containing a plurality of LED modules according to an embodiment of the present invention.

New colors such as cold white and orange apart from the four basic ones can be obtained by mixing the appropriate basic colors over a fraction of a unit switching time. This can be achieved by programming a microprocessor built into the circuit. FIG. 22A and FIG. 22B show the timing diagrams of color rendering for cold white and orange respectively. It should be noted that the entire color spectrum can be represented by varying the timing of signals L1, L2, and L3.

Figure 27:
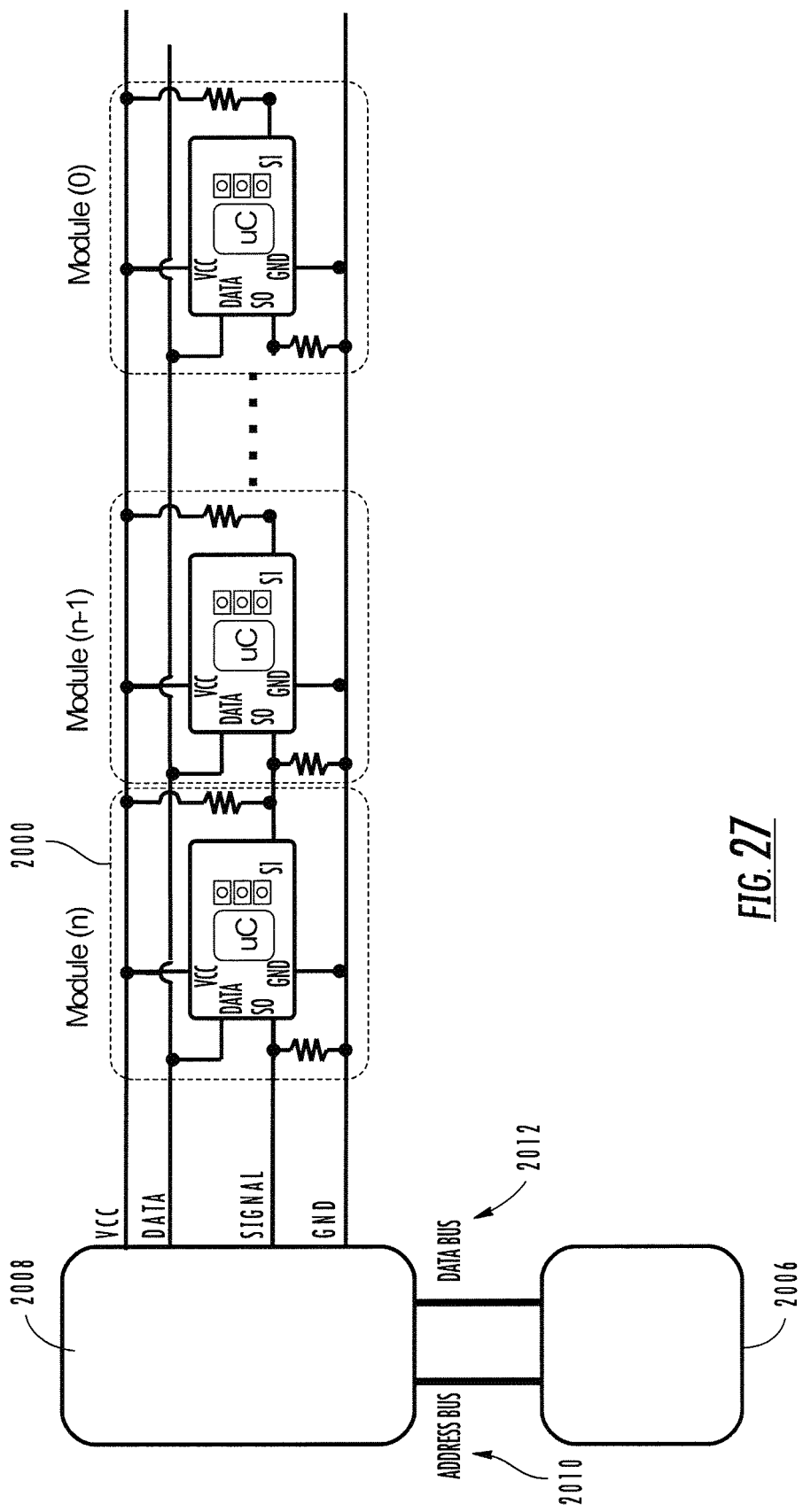
FIG. 27 is a diagram showing plural LED modules as shown in FIG. 26 connected in a light wire configuration.
Figure 28A:
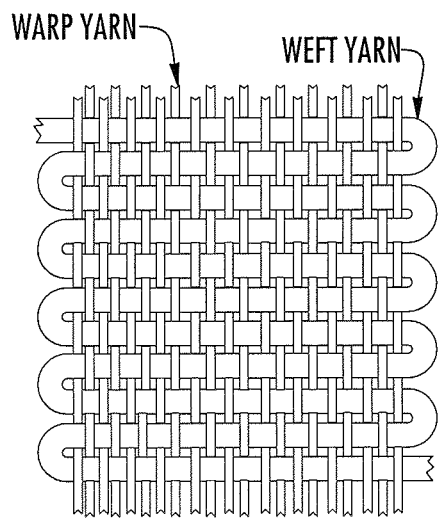
FIGS. 28A and 28B are a schematic diagram and a depiction of an exemplary weave pattern, respectively.
Figure 28B:
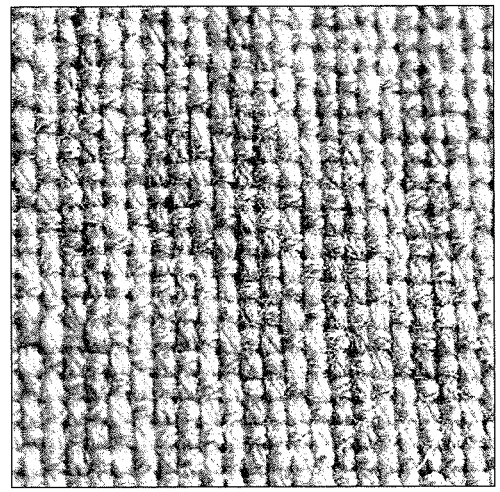
Figure 28C:
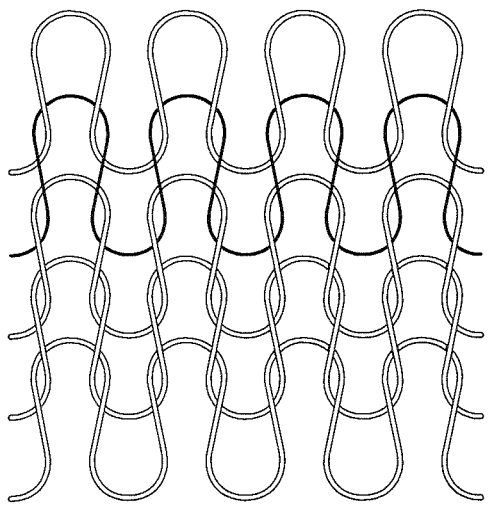
FIGS. 28C and 28D are a schematic diagram and a depiction of an exemplary knitting stitching pattern, respectively.
Figure 28D:
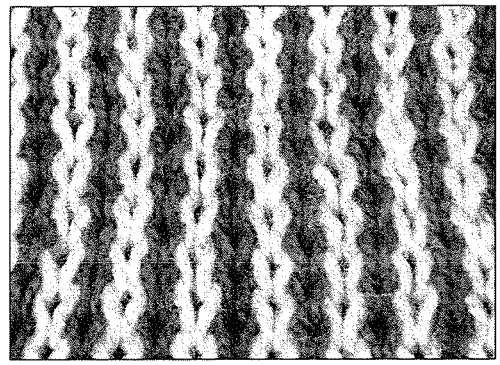

In one embodiment of the invention, the integrally formed LED light wire includes a plurality of pixels (LED modules), wherein each pixel has one or more LEDs, and each pixel can be controlled independently using a microprocessor circuit integrated with said one or more LEDs. Each pixel is a LED module comprising a microcontroller and at least one or more LEDs (e.g., a single R,G,B, or W LED, three (RGB) LEDs, or four (RGBW) LEDs). FIG. 27 illustrates an exemplary plurality of pixels (LED modules 2100), each pixel with four (RGBW) LEDs. Each LED module 2100 is assigned a unique address. When this address is triggered, that LED module is lit up. The LED modules are serially connected with a signal wire based on a daisy chain or star bus configuration. Alternatively, the LED modules 2100 are arranged in parallel.

There are two ways to assign an address for each LED module in the integrally formed LED light wire. The first approach is static addressing in which each pixel is pre-assigned a fixed address during manufacture, and is unable to monitor any changes, particularly as to pixel failure or a changed length of the LED light wire. The second approach is dynamic addressing in which each pixel is assigned an address dynamically with its own unique address and each pixel being characterized by its own "address" periodically with a trigger signal. Alternatively, the address is assigned dynamically when powered on. Because dynamic addressing allows the LED modules to reconfigure their addressing based on the signals received at an LED module, the integrally LED light wires which use such dynamically addressable LED modules can achieve flexibility as to installation, maintenance, failure detection and repair.

Figure 26:
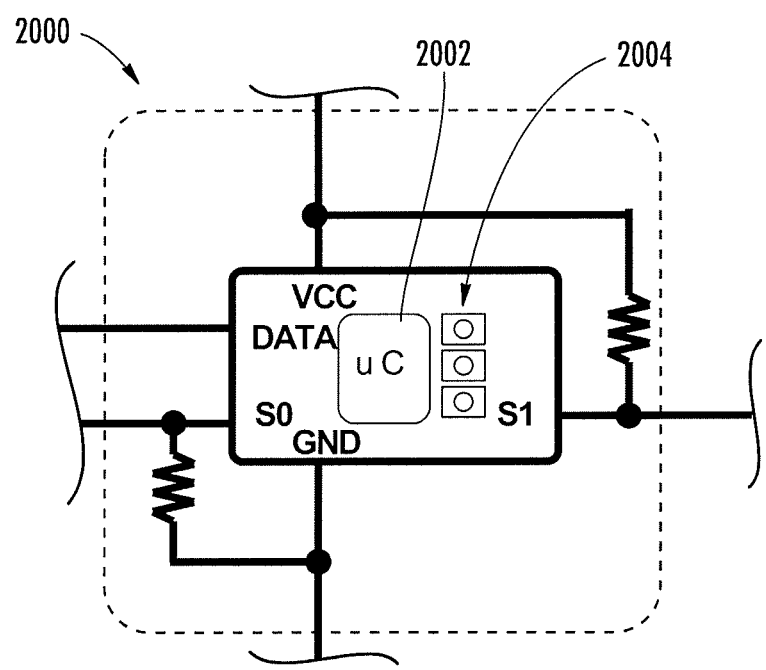
FIG. 26 is a diagram showing an LED module suitable for use in dynamic addressing in the integrally formed LED light wire described in the present application.

In an embodiment, the integrally formed LED light wire includes pixels (LED modules) in which the addresses of the pixels are assigned dynamically, by the pixels themselves, rather than preset during manufacture, as in static addressing. As shown in FIGS. 26 and 27, each LED module 2000 preferably comprises LEDs 2004 (either R,G, B or W LEDs, or a combination thereof); a microcontroller 2002; a data port (DATA); two I/O ports, one of which is configured to be the output port (S0) and one of which is configured to be the input port (S1); one power port (VCC); and one ground port (GND). The diagrammatic layout and wiring of an individual LED module 2000 is shown in FIG. 26.

The function of microcontroller 2002 in each LED module 2000 is to (a) receive data from its own data port and to receive commands and graphic signals, (b) process the dynamic address system, and (c) drive the LED(s) in their own LED module, each LED module forming a pixel.

The LED modules 2000 are preferably connected as follows:

The VCC and GND ports are each connected to the power and ground buses, respectively.

The DATA ports are connected a common bus. Such common bus can transmit control signals to and from LED modules. A control signal can be, for example, a request from a LED module to the remote display memory 2006 for data (e.g., display data (e.g., current display information)), or data from remote display memory 2006 to a specific LED module regarding current display information.

The I/O ports is an out-port and is grounded and the I/O ports S1 is an in-port and is connected to VCC. The in- and out-ports of neighboring LED modules are interconnected as shown in schematic form in FIG. 27. The in-port (S1) of the last LED module in the integrally formed LED light wire only has a connection to its out-port (S0), while its in-port (S1) is left open, designating this particular LED module as the initiating LED module for dynamic addressing when the LED light wire is powered up. In the illustrated embodiment, the last LED module is assigned position No. 0.

That is, the microcontroller of the LED module checks the status of its input port, and if that port is in an unconnected state, recognizes that the pixel to which it belongs should be assigned position 0. The microcontroller of LED module assigned position No. 0 then starts dynamically addressing by communicating its position to its neighboring LED module as No. 0 pixel and assigning thereby its neighbor's address as No. 1. The pixel with an address so assigned then communicates with its succeeding neighboring LED module, in a daisy chain recursion, assigning addresses as shown in FIG. 27. In this manner, the individual pixels, each controlled by a microcontroller, assign their own addresses when powered up and can re-assign the own addresses should the one pixel fail or the LED light wire is cut. It should be noted that the status of the ports recognized by the microcontroller is not limited to being an open state, but may be any predetermined state that could be recognized by the microcontroller as being indicative of no connection.

In a preferred embodiment, all of the LED modules 2000 share a single data line and each LED module sends to the remote display memory 2006 requests for data (e.g., display data (e.g., current display information)), which data is changed and refreshed by the display controller 2008. The display controller 2008 would typically be programmed to update the display data in the display memory 2006, and each pixel (LED module) picks up its respective data from the display memory 2006. A function of the display controller 2008 is to change and refresh the display memory. The display memory 2006 and display controller 2008 would preferably communicate with one another by the use of address bus 2010 and data bus 2012, as is known to those skilled in the art.

The integrally formed LED light wires containing LED modules can be cut to any desired length, even when powered on and functioning. If the integrally formed LED light wire is either cut while powered on, or cut while powered off and afterwards powered on, the cut creates an open circuit and the S1 port of the LED module preceding the cut becomes disconnected. Because the microcontroller of the LED module preceding the cut would now recognize that its S1 port is open, it would then assign itself position No. 0, and by the process described above become the new initiating LED module for dynamic addressing. All preceding LED modules acquire new addresses corresponding to the new initiating LED module.

Figure 17A:
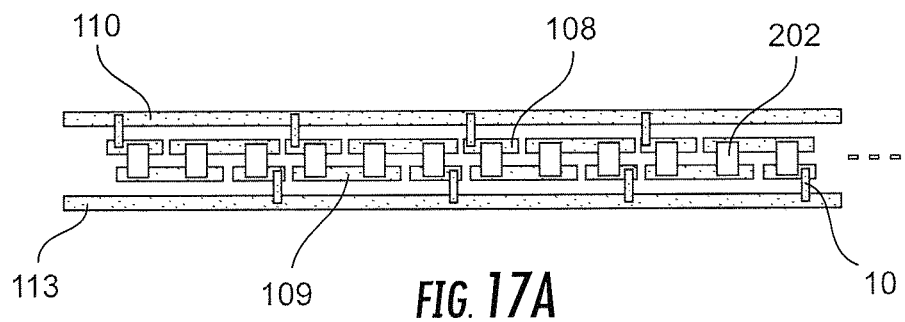
FIG. 17A is a block diagram of an integrally formed LED light wire according to another embodiment of the present invention.
Figure 17B:
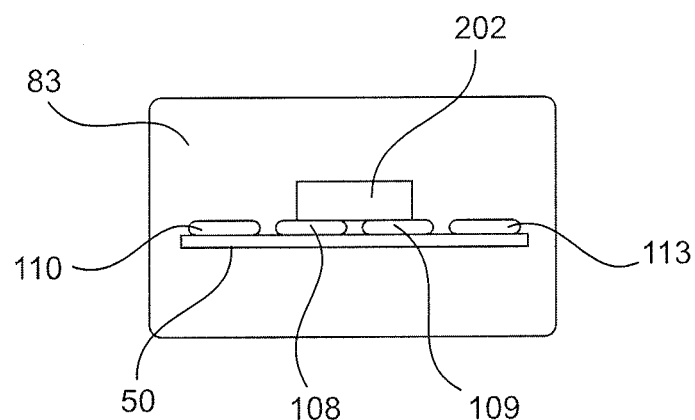
FIG. 17B is a cross-sectional view of the integrally formed LED light wire shown in FIG. 17A.
Figure 17C:
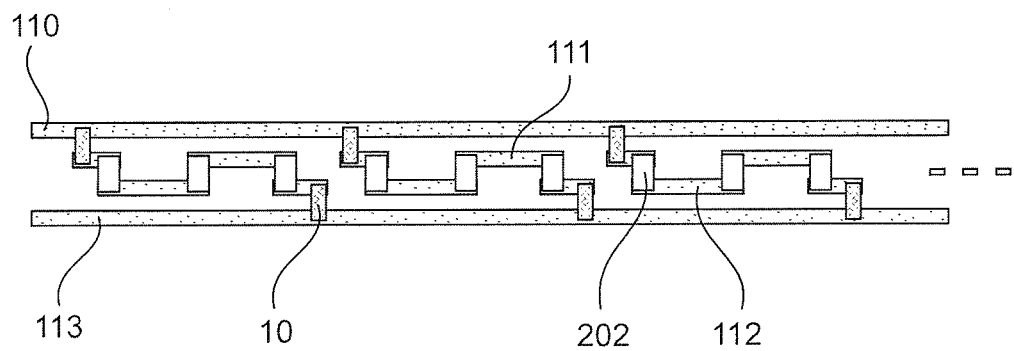
FIG. 17C is a block diagram illustrating an integrally formed LED light wire according to an embodiment of the present invention.

FIGS. 17A-17C depict an embodiment of the LED light wire using a series and parallel connection. This embodiment allows the LEDs to be turned through 90° (positioned transversely instead of longitudinally) and mounted at a much closer pitch.

Figure 18:
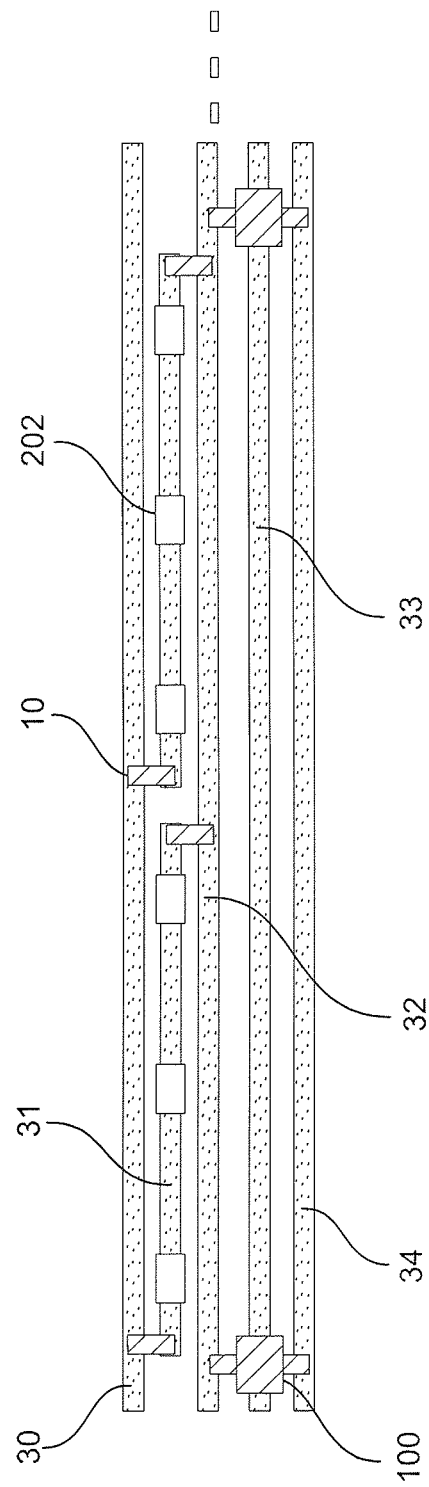
FIG. 18 is a block diagram illustrating an integrally formed LED light wire containing at least a sensor or detector according to an embodiment of the present invention.

As shown in FIGS. 18 thru 19B and 24, the integrally formed LED light wire may have a plurality of conductors (e.g., conductive bus elements and conductive segments) which are coupled by zero ohm jumpers or resistors, LEDs, sensors, detectors and/or microprocessors, and are mounted on a support substrate. The functionality of the LED light wire increases with each additional conductor. For example, a sensor or detector which monitors environment conditions (such as humidity, temperature, and brightness) may be integrated in the LED light wire, and connected in such a manner that it may influence the lighting characteristics of the LED light wire. FIG. 18 shows an embodiment of the integrally formed LED light wire with sensors or detectors. As shown, there are four continuous conductors corresponding to conductive bus elements 30, 32, 33 and 34. Zero ohm jumpers or resistors 10 couple conductive segments 31 to conductive bus elements 30 and 32. Conductor bus element 32 acts as a common ground. Conductive bus element 30 provides power to the LEDs 202, while conductive bus element 34 provides power to the sensor/detector 100. Conductive bus element 33 may direct the signal from the sensor/detector 100 to a power source which supplies power to the LEDs 202; thereby, allowing the sensor/detector 100 to influence the lighting characteristics (e.g., intensity, color, pattern, on/off) of the LEDs 202.

Figure 19A:
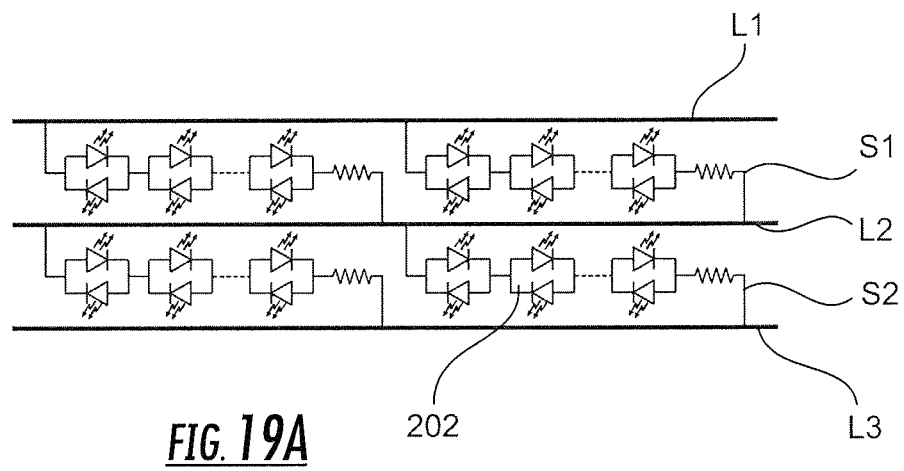
FIG. 19A is a schematic diagram of a full color integrally formed LED light wire according to an embodiment of the present invention.
Figure 19B:
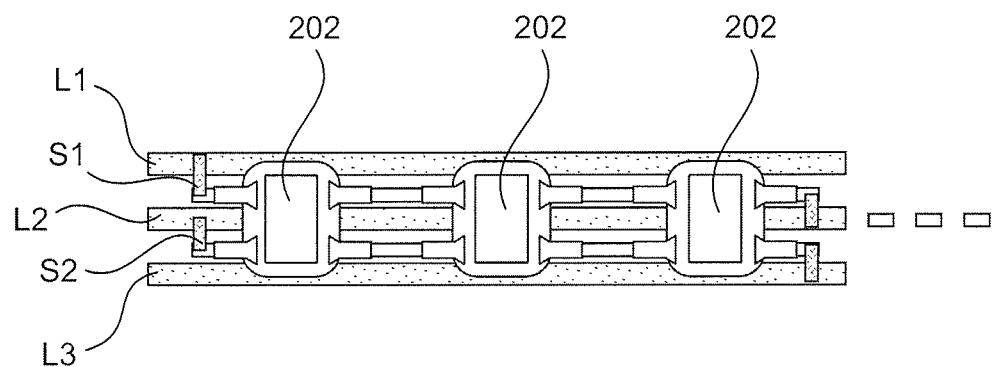
FIG. 19B is a block diagram illustrating an embodiment of the integrally formed LED light wire shown in FIG. 19A.

FIGS. 19A and 19B show a full color integrally formed LED light wire having three continuous conductors corresponding to conductive bus elements L1, L2 and L3 which supply power to the LEDs 202, and conductor segments S1 and S2 connecting the LEDs 202 to conductive bus elements L1, L2 and/or L3. In FIG. 19B, the LEDs 202 are SMD-On-Board LEDs.

Figure 24:
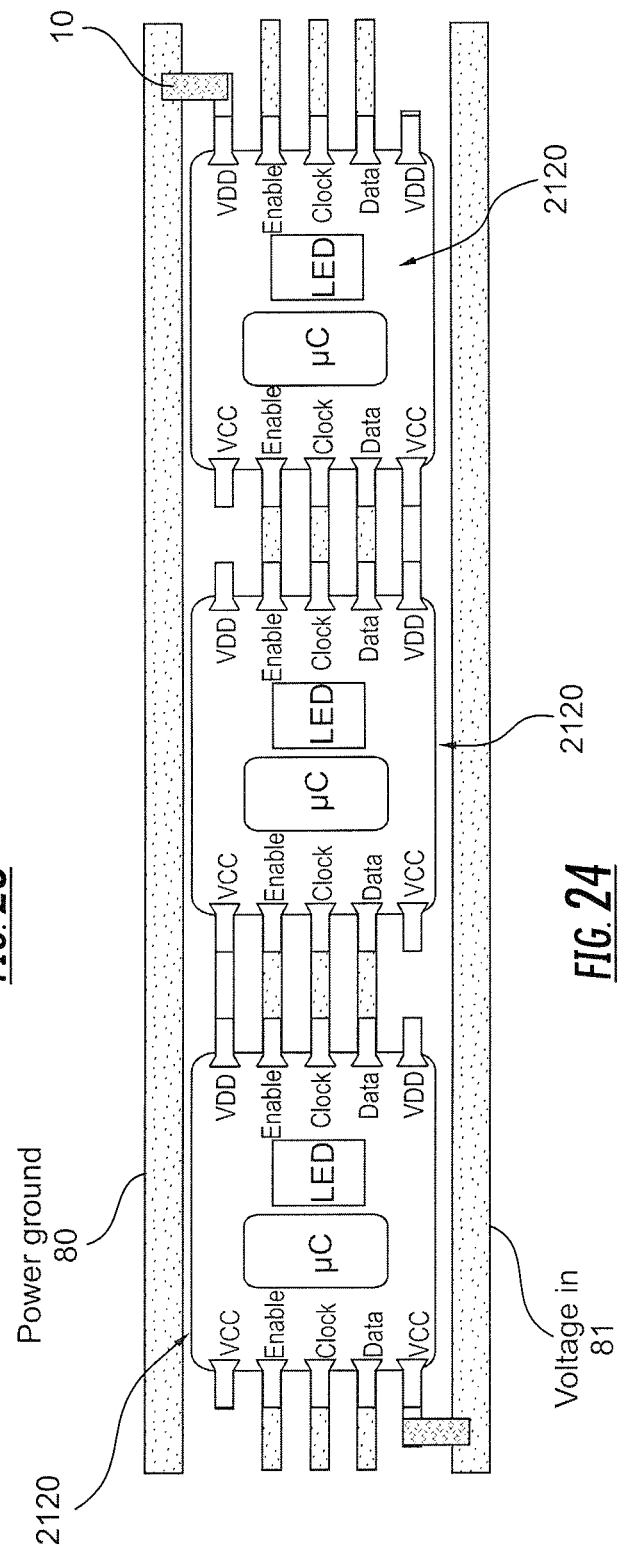
FIG. 24 is a layout diagram of the integrally formed LED light wire shown in FIG. 23.

In another embodiment, each pixel (LED module) may be controlled independently. FIG. 24 shows the configuration of an individually controllable LED light wire using seven conductors and LED modules 2120. Here, conductive bus element 80 acts as a power ground, while conductive bus element 81 acts as a voltage in. Each LED module 2120 includes a microprocessor, at least one LED, power input and output connections, control signal input and output connections, and data input and output connections. In FIG. 24, the LED modules 2120 include VCC pins, VDD pins, enable pins, clock pins and data pins. The control signal and data input connections of each LED module are coupled to the control signal and data input connections of an adjacent LED module. An optocoupler may be used to insulate the control signal line between each LED module. The LED modules 2120 may be connected in series (for example, as shown in FIG. 24) or in parallel (for example, the power input connections of each LED module 2120 is coupled to the first conductive bus element 81 and the power output connection of each LED module 2120 is coupled to the second conductive bus element 80).

Figure 25A:
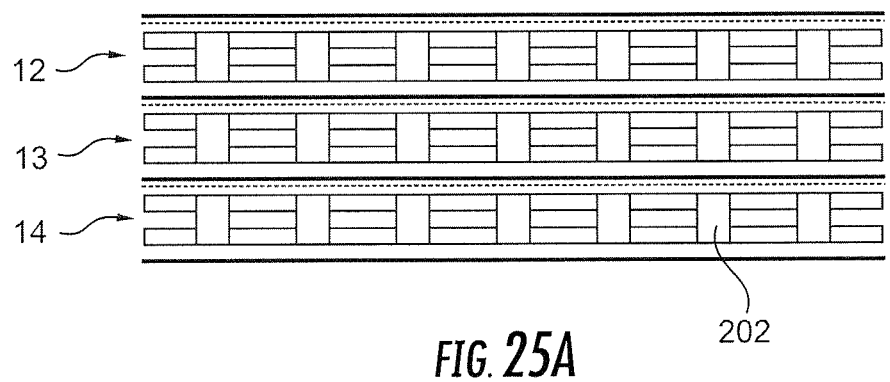
FIG. 25A is a block diagram illustrating a lighting panel comprising a plurality of integrally formed LED light wires with interlocking alignment system according to an embodiment of the present invention.
Figure 25B:
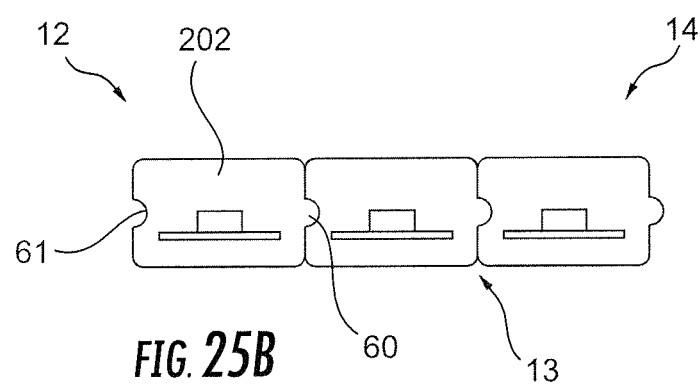
FIG. 25B is a cross-sectional view of the lighting panel shown in FIG. 25A.
Figure 25C:
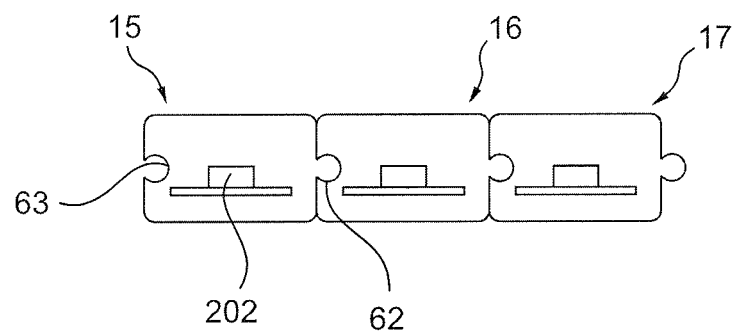
FIG. 25C is a cross-sectional view of a lighting panel comprising a plurality of integrally formed LED light wires according to another embodiment of the present invention

A plurality of integrally formed LED light wires (such as LED light wire 12, 13, 14) may be aligned side-by-side to form a lighting panel 3000 as shown in FIGS. 25A-25C. Each LED light wire may contain an interlocking alignment system comprising an alignment key 60, 62 and an alignment keyhole 61, both of which are pre-formed in the encapsulant of the LED light wire, wherein the alignment key 60, 62 and the alignment keyhole 61 are located at opposite sides of the LED light wire. The alignment key 60, 62 and the alignment keyhole 61, 63 may continuously extend or intermittently extend longitudinally along the length of the LED light wire. The alignment keyhole 61, 63 may be in the form of a notch, a groove, a recess, a slot, or an aperture, and the alignment key 60, 62 may be in a form (including, but without limitation, a rail or a peg) which permits a friction fit (preferably, a snug fit) to the alignment keyhole 61, 63. The alignment key 60, 62 may have a width approximately equal to or slightly larger than the width of the alignment keyhole 61, 63, such that the alignment key 60, 62 may fit therein in a friction fit, as shown in FIGS. 25B and 25C. As an example, the alignment keyhole 61, 63 may be a groove being adapted to friction fit with a rail-shaped alignment key 60, 62, both groove-shaped alignment keyhole 61, 63 and rail-shaped alignment 60 continuously extending longitudinally along the length of the LED light wire.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrally formed LED light wire, comprising
 (a) a conductive base comprising
  a support substrate, wherein the support substrate comprises a first plurality of wires, threads, or a combination thereof, wherein the plurality of wires, threads, or a combination thereof comprises at least one weft element arranged in a first direction and at least two warp elements, each arranged in a second direction such that the at least one weft element and each of the at least two warp elements form plural intersections therebetween,
  a first bus element formed from a second plurality of wires, threads, or a combination thereof adapted to distribute power from a power source,
  a second bus element formed from a third plurality of wires, threads, or a combination thereof adapted to distribute power from the power source,
  a third bus element formed from a fourth plurality of wires, threads, or a combination thereof adapted to distribute a control signal,
  wherein the first, second, and third bus elements are woven, stitched, or knitted into the support substrate; and
 (b) a plurality of light emitting diode (LED) modules, each of said plurality of LED modules comprising a microcontroller and at least one LED, each LED module having first, second, and third electrical contacts electrically coupled to the first, second, and third bus elements, respectively, to draw power from the first and second bus elements and to receive a control signal from the third bus elements.

2. The integrally formed LED light wire of claim 1, further comprising an encapsulant completely encapsulating the conductive base and the plurality of LED modules, including the respective microcontrollers.

3. The integrally formed LED light wire of claim 2, the encapsulant further comprises light scattering particles.

4. The integrally formed LED light wire of claim 1, further comprising at least one support warp which comprises a fifth plurality of wires, threads, or a combination thereof arranged in the second direction.

5. The integrally formed LED light wire of claim 1, wherein a connection between each of the plurality of LED modules and at least one of the bus elements is selected from the group consisting of stitching, weaving, knitting, crimping, soldering, welding, or a combination thereof.

6. The integrally formed LED light wire of claim 1, wherein the second, third and fourth plurality of wires, threads, or a combination thereof are each made of a plurality of conductive wires and/or threads.

7. The integrally formed LED light wire of claim 4, wherein the fifth plurality of wires, threads, or a combination thereof is made of a plurality of non-conductive wires and/or threads.

8. The integrally formed LED light wire of claim 6, wherein the conductive wires and/or threads is selected from the group consisting of nickel wire, steel wire, iron wire, titanium wire, copper wire, brass wire, aluminum wire, tin wire, sliver wire, nickel thread, steel thread, iron thread, titanium thread, copper thread, brass thread, aluminum thread, tin thread, sliver thread, or the like, or a combination thereof.

9. The integrally formed LED light wire of claim 7, wherein the non-conductive wires and/or threads is selected from the group consisting of kevlar wire, nylon wire, cotton wire, rayon wire, polyester wire, laminate thread, flat thread, silk thread, glass fiber, polytetrafluoroethylene ("PTFE"), kevlar thread, nylon thread, cotton thread, rayon thread, polyester thread, a solid polymeric material, or the like, or a combination thereof.

10. The integrally formed LED light wire of claim 1, wherein each of the plurality of LED modules further comprises a plurality of LEDs, wherein the plurality of LEDs are selected from the group consisting of red, blue, green, and white LEDs.

11. The integrally formed LED light wire of claim 1, wherein each of the plurality of LED modules further comprises a fourth contact for outputting the received control signal.

12. The integrally formed LED light wire of claim 1, wherein each LED module has a unique address used to control the LED module.

13. The integrally formed LED light wire of claim 12, wherein the unique address is static.

14. The integrally formed LED light wire of claim 12, wherein the unique address is dynamic.

15. An integrally formed LED light wire, comprising:
(a) a conductive base comprising
a support substrate, wherein the support substrate comprises a first plurality of wires, threads, or a combination thereof, wherein the plurality of wires, threads, or a combination thereof comprises at least one weft element arranged in a first direction and at least two warp elements, each arranged in a second direction such that the at least one weft element and each of the at least two warp elements form plural intersections therebetween,
a first, second, third, and fourth conductive bus elements, each formed from a second, third, fourth, and fifth plurality of wires, threads, or a combination thereof, respectively, wherein the first, second, third, and fourth conductive bus elements are woven, stitched, or knitted into the support substrate; and
at least one conductor segment arranged between the first and second conductive bus elements, the at least one conductor segment comprising at least one LED and a sixth plurality of wires, threads, or a combination thereof, wherein the at least one conductor segment is woven, stitched, or knitted into the support substrate; and
(b) at least one sensor electrically coupled to the third and fourth conductive bus elements, the third conductive bus element is adapted to transmit signals from the at least one sensor, and the fourth conductive bus is adapted to provide power to the at least one sensor.

16. The integrally formed LED light wire of claim 15, wherein the second conductive bus element is a ground and the at least one sensor is additionally electrically coupled to the second conductive bus element.

17. The integrally formed LED light wire of claim 15, further comprising an encapsulant completely encapsulating the conductive base, and the at least one sensor electrically coupled to the third and fourth conductive bus elements.

18. The integrally formed LED light wire of claim 17, wherein the encapsulant further comprises light scattering particles.

19. The integrally formed LED light wire of claim 11, wherein a connection between the at least one LED and the sixth plurality of wires is selected from the group consisting of stitching, weaving, knitting, crimping, soldering, welding, or a combination thereof.

20. The integrally formed LED light wire of claim 2 or 17, wherein the outer profile of the encapsulant comprising an alignment key and an alignment keyhole located at opposite sides of the integrally formed LED light wire.

21. A lighting panel comprising a plurality of the integrally formed LED light wires of claim 20.

* * * * *